(12) United States Patent
Mushiga et al.

(10) Patent No.: US 10,354,987 B1
(45) Date of Patent: Jul. 16, 2019

(54) THREE-DIMENSIONAL MEMORY DEVICE CONTAINING BONDED CHIP ASSEMBLY WITH THROUGH-SUBSTRATE VIA STRUCTURES AND METHOD OF MAKING THE SAME

(71) Applicant: SANDISK TECHNOLOGIES LLC, Plano, TX (US)

(72) Inventors: Mitsuteru Mushiga, Yokkaichi (JP); Akio Nishida, Yokkaichi (JP); Kenji Sugiura, Yokkaichi (JP); Hisakazu Otoi, Yokkaichi (JP); Masatoshi Nishikawa, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/928,340

(22) Filed: Mar. 22, 2018

(51) Int. Cl.
*H01L 25/00* (2006.01)
*H01L 23/48* (2006.01)
(Continued)

(52) U.S. Cl.
CPC ........ *H01L 25/50* (2013.01); *H01L 21/76898* (2013.01); *H01L 23/481* (2013.01); *H01L 24/03* (2013.01); *H01L 24/05* (2013.01); *H01L 24/06* (2013.01); *H01L 24/08* (2013.01); *H01L 24/80* (2013.01); *H01L 25/18* (2013.01); *H01L 21/76843* (2013.01); *H01L 27/11556* (2013.01);
(Continued)

(58) Field of Classification Search
CPC .... H01L 25/50; H01L 24/08; H01L 21/76898
See application file for complete search history.

(56) References Cited

U.S. PATENT DOCUMENTS 5,717,231 A * 2/1998 Tserng ................ H01L 23/3672
257/276
5,915,167 A 6/1999 Leedy
(Continued)

FOREIGN PATENT DOCUMENTS

| JP | 2016-004860 A | 1/2016 |
| JP | 2016-157832 A | 9/2016 |
| JP | 2017-130660 A | 7/2017 |

OTHER PUBLICATIONS

Ariyoshi, J. et al., "Compact Three-Dimensional Memory Device Having a Seal Ring and Methods of Manufacturing the Same," U.S. Appl. No. 15/928,337, filed Mar. 22, 2018.
(Continued)

*Primary Examiner* — William Coleman
(74) *Attorney, Agent, or Firm* — The Marbury Law Group PLLC

(57) ABSTRACT

Sacrificial pillar structures are formed through a first semiconductor substrate on which first semiconductor devices are subsequently formed. After backside thinning of the first semiconductor substrate, the sacrificial pillar structures are replaced with integrated through-substrate via and pad structures to provide a first semiconductor chip. A second semiconductor chip is provided, which includes a second semiconductor substrate, second semiconductor devices, and second bonding pad structures electrically connected to a respective one of the second semiconductor devices. The first bonding pad structures are bonded to a respective one of the second bonding pad structures by surface activated bonding.

20 Claims, 29 Drawing Sheets

(51) Int. Cl.
*H01L 23/00* (2006.01)
*H01L 21/768* (2006.01)
*H01L 25/18* (2006.01)
*H01L 27/11582* (2017.01)
*H01L 27/11556* (2017.01)

(52) U.S. Cl.
CPC .............. *H01L 27/11582* (2013.01); *H01L 2224/03462* (2013.01); *H01L 2224/03464* (2013.01); *H01L 2224/05009* (2013.01); *H01L 2224/05025* (2013.01); *H01L 2224/0557* (2013.01); *H01L 2224/05562* (2013.01); *H01L 2224/05567* (2013.01); *H01L 2224/06181* (2013.01); *H01L 2224/08146* (2013.01); *H01L 2224/80895* (2013.01); *H01L 2924/1431* (2013.01); *H01L 2924/14511* (2013.01)

(56) References Cited

U.S. PATENT DOCUMENTS

| | | | |
|---|---|---|---|
| 7,368,328 B2 | 5/2008 | Abbott et al. | |
| 7,557,439 B1 | 7/2009 | Sasaki et al. | |
| 7,585,419 B2 | 9/2009 | Cheng | |
| 7,602,028 B2 | 10/2009 | Son et al. | |
| 8,242,593 B2 | 8/2012 | Kacker et al. | |
| 8,247,260 B2 | 8/2012 | Sivaram et al. | |
| 8,803,206 B1 * | 8/2014 | Or-Bach | H01L 25/0657 257/278 |
| 9,240,330 B2 * | 1/2016 | Takeda | H01L 21/486 |
| 9,257,414 B2 | 2/2016 | Chen et al. | |
| 9,293,630 B2 * | 3/2016 | Kim | H01L 31/18 |
| 9,305,934 B1 | 4/2016 | Ding et al. | |
| 9,449,987 B1 | 9/2016 | Miyata et al. | |
| 9,502,471 B1 | 11/2016 | Lu et al. | |
| 9,530,790 B1 | 12/2016 | Lu et al. | |
| 9,543,318 B1 | 1/2017 | Lu et al. | |
| 9,741,694 B2 * | 8/2017 | Yu | H01L 25/0655 |
| 2005/0280112 A1 | 12/2005 | Abbott | |
| 2006/0097363 A1 | 5/2006 | Abbott et al. | |
| 2006/0286485 A1 | 12/2006 | Cheng | |
| 2007/0090524 A1 | 4/2007 | Abbott | |
| 2007/0132085 A1 | 6/2007 | Shibata et al. | |
| 2007/0194455 A1 | 8/2007 | Ikeda et al. | |
| 2007/0269932 A1 | 11/2007 | Abbott et al. | |
| 2008/0087932 A1 | 4/2008 | Son et al. | |
| 2008/0150155 A1 | 6/2008 | Periaman et al. | |
| 2008/0315421 A1 | 12/2008 | Periaman et al. | |
| 2009/0039492 A1 | 2/2009 | Kang et al. | |
| 2009/0108469 A1 | 4/2009 | Kang et al. | |
| 2009/0189290 A1 | 7/2009 | Kacker et al. | |
| 2010/0009488 A1 | 1/2010 | Sivaram et al. | |
| 2010/0240174 A1 | 9/2010 | Yu et al. | |
| 2010/0283145 A1 | 11/2010 | Chang et al. | |
| 2011/0024910 A1 | 2/2011 | Mostafazadeh et al. | |
| 2011/0316159 A1 | 12/2011 | Kang et al. | |
| 2012/0049361 A1 | 3/2012 | Park et al. | |
| 2012/0051113 A1 | 3/2012 | Choi et al. | |
| 2012/0061827 A1 | 3/2012 | Fujita | |
| 2012/0243355 A1 | 9/2012 | Shin et al. | |
| 2012/0267689 A1 | 10/2012 | Chen et al. | |
| 2013/0021866 A1 | 1/2013 | Lee | |
| 2013/0026652 A1 | 1/2013 | Fujii | |
| 2013/0147041 A1 | 6/2013 | Chan et al. | |
| 2013/0187280 A1 | 7/2013 | Yuan et al. | |
| 2013/0193585 A1 | 8/2013 | Lin et al. | |
| 2014/0084375 A1 | 3/2014 | Lee et al. | |
| 2014/0117430 A1 | 5/2014 | Lee et al. | |
| 2015/0064899 A1 | 3/2015 | Ji et al. | |
| 2015/0061099 A1 | 5/2015 | Mu et al. | |
| 2015/0187742 A1 * | 7/2015 | Kwon | H01L 24/82 257/774 |
| 2015/0294955 A1 | 10/2015 | Chen et al. | |
| 2015/0357240 A1 | 12/2015 | Law et al. | |
| 2016/0079164 A1 | 3/2016 | Fukuzumi et al. | |
| 2016/0133603 A1 | 5/2016 | Ahn et al. | |
| 2016/0307910 A1 | 10/2016 | Son et al. | |
| 2018/0204791 A1 * | 7/2018 | Chen | H01L 23/49827 |

OTHER PUBLICATIONS

Mushiga, M. et al., "Three-Dimensional Memory Device Containing Bonded Chip Assembly With Through-Substrate Via Structures and Method of Making the Same," U.S. Appl. No. 15/928,407, filed Mar. 22, 2018.
U.S. Appl. No. 15/638,672, filed Jun. 30, 2017, Sandisk Technologies LLC.
U.S. Appl. No. 15/873,101, filed Jan. 17, 2018, Sandisk Technologies LLC.
U.S. Appl. No. 15/892,648, filed Feb. 9, 2018, Sandisk Technologies LLC.
USPTO Non-Final Office Action for U.S. Appl. No. 15/928,407, issued Dec. 17, 2018, 14 pages.
International Search Report and Written Opinion of the International Searching Authority for International Patent Application No. PCT/US2018/062107, dated Mar. 14, 2019, 12 pages.

* cited by examiner

US 10,354,987 B1

THREE-DIMENSIONAL MEMORY DEVICE CONTAINING BONDED CHIP ASSEMBLY WITH THROUGH-SUBSTRATE VIA STRUCTURES AND METHOD OF MAKING THE SAME

FIELD

The present disclosure relates generally to the field of semiconductor devices, and particularly to a three-dimensional memory device containing bonded chip assemblies with through-substrate via (TSV) structures and methods of manufacturing the same.

BACKGROUND

Three-dimensional NAND flash memory devices can be used in imaging products, removable storage products, enterprise and client solid state devices, and embedded memory devices. In order to achieve high density at a lower cost, the pitch of memory openings should be reduced, and the number of word lines in an alternating stack of insulating layers and word lines should be increased. This increases the complexity of the etch process for forming memory openings and the metal replacement process employed to form the word lines. Use of multi-tier structures for the three-dimensional NAND memory devices further increases complexity in the manufacturing process.

SUMMARY

According to an aspect of the present disclosure, a chip assembly structure is provided, which comprises: a first semiconductor chip comprising a first semiconductor substrate, first semiconductor devices located over a front side surface of the first semiconductor substrate, and first integrated through-substrate via and pad structures including a respective first through-substrate via structure and a respective first bonding pad structure and comprising a first metallic material, wherein the first integrated through-substrate via and pad structures vertically extend from the front side surface of the first semiconductor substrate to a backside surface of the first semiconductor substrate and are electrically isolated from the first semiconductor substrate by a respective tubular insulating spacer and by a backside insulating layer contacting the backside surface of the first semiconductor substrate, wherein each of the first integrated through-substrate via and pad structures has a greater lateral dimension within a horizontal plane including the front side surface of the first semiconductor substrate than within a horizontal plane including the backside surface of the first semiconductor substrate; and a second semiconductor chip comprising a second semiconductor substrate, second semiconductor devices located over a front side surface of the second semiconductor substrate, and second bonding pad structures electrically connected to a respective one of the second semiconductor devices, wherein the first bonding pad structures are directly bonded to a respective one of the second bonding pad structures.

According to another aspect of the present disclosure, a chip assembly structure is provided, which comprises: a first semiconductor chip comprising a first semiconductor substrate, first semiconductor devices located over a front side surface of the first semiconductor substrate, first through-substrate via structures vertically extending from the front side surface of the first semiconductor substrate to a backside surface of the first semiconductor substrate and are electrically isolated from the first semiconductor substrate by a respective tubular insulating spacer and by a backside insulating layer contacting the backside surface of the first semiconductor substrate, and first backside bonding pad structures located on the first through-substrate via structures at a backside of the first semiconductor substrate, wherein the first semiconductor devices comprise a three-dimensional memory device including an alternating stack of insulating layers and electrically conductive layers and a two-dimensional array of memory stack structures including a respective vertical stack of memory elements located at levels of the electrically conductive layers, a second semiconductor chip comprising a second semiconductor substrate, second semiconductor devices located over a front side surface of the second semiconductor substrate, and second bonding pad structures electrically connected to a respective one of the second semiconductor devices, wherein the first backside bonding pad structures are directly bonded to a respective one of the second bonding pad structures, wherein the second semiconductor devices in the second semiconductor chip comprise peripheral devices that provide control signals for operation of the two-dimensional array of memory stack structures in the first semiconductor chip, and a third semiconductor chip comprising a third semiconductor substrate, third semiconductor devices located over a front side surface of the third semiconductor substrate, and third-chip backside bonding pad structures electrically connected to a respective one of the third semiconductor devices, wherein the first semiconductor chip further comprises first front side bonding pad structures electrically connected to the first backside bonding pad structures and directly bonded to a respective one of the third-chip backside bonding pad structures.

According to yet another aspect of the present disclosure, a method of forming a chip assembly structure comprises forming sacrificial pillar structures extending from a front side surface of the first semiconductor substrate toward an in-process backside surface of the first semiconductor substrate, forming first semiconductor devices over the front surface of the first semiconductor substrate, thinning the first semiconductor substrate after forming the first semiconductor devices by removing a material of the first semiconductor substrate from above the in-process backside surface until the sacrificial pillar structures are exposed in a backside surface of the first semiconductor substrate, forming through-substrate cavities by removing the sacrificial pillar structures, forming first integrated through-substrate via and pad structures in the through-substrate cavities and over the backside surface of the first semiconductor substrate; and bonding the first integrated through-substrate via and pad structures to respective one of second bonding pads located on a second semiconductor substrate by surface activated bonding.

According to yet another aspect of the present disclosure, a method of forming a chip assembly structure is provided, which comprises: providing a first semiconductor chip comprising a first semiconductor substrate, first semiconductor devices located over a front side surface of the first semiconductor substrate, and first integrated through-substrate via and pad structures including a respective first through-substrate via structure and a respective first bonding pad structure and comprising a first metallic material, wherein the first integrated through-substrate via and pad structures vertically extend from the front side surface of the first semiconductor substrate to a backside surface of the first semiconductor substrate and are electrically isolated from the first semiconductor substrate by a respective tubular insulating spacer and by a backside insulating layer contacting the backside surface of the first semiconductor substrate, wherein each of the first integrated through-substrate via and pad structures has a greater lateral dimension within a horizontal plane including the front side surface of the first semiconductor substrate than within a horizontal plane including the backside surface of the first semiconductor substrate; providing a second semiconductor chip comprising a second semiconductor substrate, second semiconductor devices located over a front side surface of the second semiconductor substrate, and second bonding pad structures electrically connected to a respective one of the second semiconductor devices; and bonding the first semiconductor chip and the second semiconductor chip by aligning the first bonding pad structures with a respective one of the second bonding pad structures and inducing surface activated bonding between the first and second bonding pad structures.

According to still another aspect of the present disclosure, a method of forming a chip assembly structure is provided, which comprises the steps of: providing a first semiconductor chip comprising a first semiconductor substrate, first semiconductor devices located over a front side surface of the first semiconductor substrate, first through-substrate via structures vertically extending from the front side surface of the first semiconductor substrate to a backside surface of the first semiconductor substrate and are electrically isolated from the first semiconductor substrate by a respective tubular insulating spacer and by a backside insulating layer contacting the backside surface of the first semiconductor substrate, first backside bonding pad structures located on the first through-substrate via structures at a backside of the first semiconductor substrate, and first front side bonding pad structures electrically connected to the first integrated through-substrate via and pad structures, wherein the first semiconductor devices comprise a three-dimensional memory device including an alternating stack of insulating layers and electrically conductive layers and a two-dimensional array of memory stack structures including a respective vertical stack of memory elements located at levels of the electrically conductive layers, providing a second semiconductor chip comprising a second semiconductor substrate, second semiconductor devices located over a front side surface of the second semiconductor substrate, and second bonding pad structures electrically connected to a respective one of the second semiconductor devices, wherein the second semiconductor devices in the second semiconductor chip comprise peripheral devices that provide control signals for operation of the three-dimensional memory device of the first semiconductor chip, bonding the first backside bonding pad structures to a respective one of the second bonding pad structures by surface activated bonding, providing a third semiconductor chip comprising a third semiconductor substrate, third semiconductor devices located over a front side surface of the third semiconductor substrate, and third-chip bonding pad structures electrically connected to a respective one of the third semiconductor devices, and bonding the first front side bonding pad structures on the first semiconductor chip to a respective one of the third-chip bonding pad structures by surface activated bonding.

DETAILED DESCRIPTION

Figure 1A:
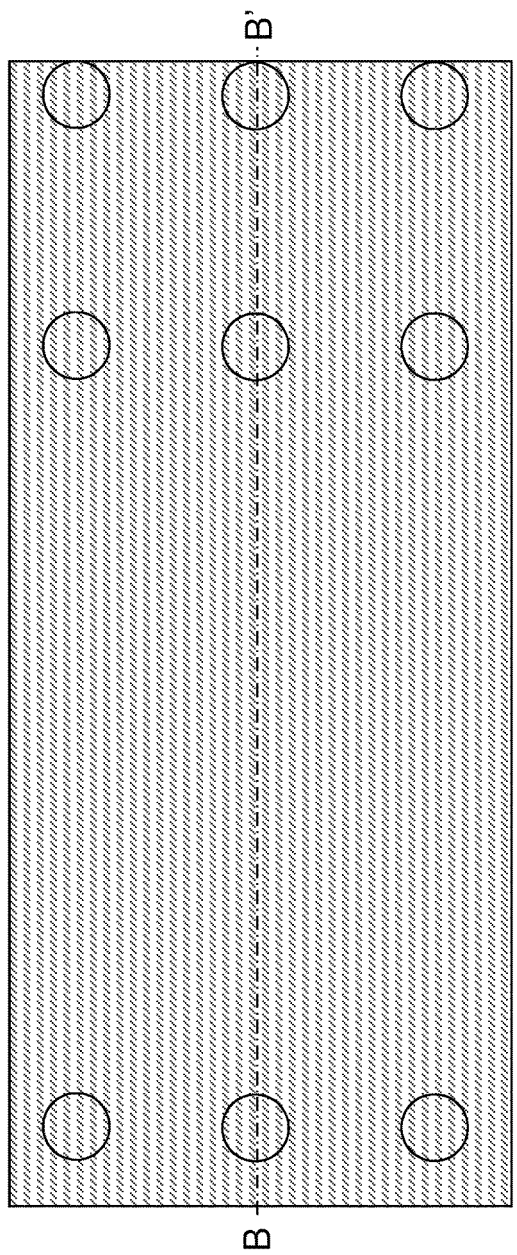
FIG. 1A is a top-down view of a first exemplary structure including a first semiconductor substrate after formation of via openings through an upper portion of the first semiconductor substrate according to an embodiment of the present disclosure.

The present inventors realized that CMOS processes for forming transistors in a CMOS configuration (e.g., CMOS devices) for peripheral (e.g., driver) circuitry for the three-dimensional NAND memory devices are dependent on the overall thermal budget of the memory device. The high thermal budget used to form the three-dimensional NAND memory devices has a negative effect on the doped regions and layers of the CMOS device performance while shrinking the CMOS device size. In particular, CMOS-under-array (CUA) type peripheral circuits which are located directly below the three-dimensional NAND memory devices are negatively affected by hydrogen diffusion from the overlying memory devices.

Therefore, in one embodiment of the present disclosure, the peripheral circuits containing the CMOS devices can be formed on a separate substrate from the substrate containing three-dimensional NAND memory devices. The substrates can then be bonded to each other to form a bonded structure (e.g., a chip assembly structures) containing both the peripheral circuit substrate bonded to the three-dimensional NAND memory device substrate. The peripheral circuits may be located directly under the three-dimensional NAND memory devices in the bonded structure, which results in the CUA type peripheral circuits. In one embodiment of the present disclosure, at least one of the above substrates can include through-substrate via structures to interconnect the memory and CMOS peripheral devices.

In a via-middle process integration scheme, the through-substrate via structures are formed from the front side of the substrate before performing back-end-of-line (BEOL) processes that form metal interconnect structures. The substrate is subsequently thinned by backside grinding, which exposes copper or another conductor of the through-substrate via structures. The thinned substrate can be subsequently bonded to another substrate employing bump processes. However, a typical thermal budget limitation lower than 500 degrees Celsius is imposed after beginning of the BEOL processes, and containment of copper contamination after exposure of copper through backside grinding poses a challenge.

In the via-last process integration scheme, the through-substrate via structures are formed after formation of the metal interconnect structures and backside grinding of the substrate. In this scheme, a support wafer is typically used for wafer thinning, and thus, dielectric film deposition processes are conducted at low temperatures, such as lower than 230 degrees Celsius, for example. In addition, both a high level of wafer thinning uniformity and a high level of through-substrate via reactive ion etch (RIE) depth uniformity are desired, which increases process complexity.

Both the via-middle process integration scheme and the via-last process integration scheme have challenges in unit processes in order to provide high wafer chip yield. Various embodiments of the present disclosure provide a replacement-scheme through-substrate via (TSV) first process integration scheme. At least one CMOS chip and at least one memory chip can be separately formed on different substrates, and can be bonded together (e.g., by a surface activated bonding process, such as copper direct bonding) to form the chip assembly structure.

The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements.

As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the embodiments of the present disclosure can include monolithic three-dimensional NAND memory devices assembled non-monolithically with the CMOS containing peripheral (i.e., driver) circuits into a chip assembly.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Figure 1B:
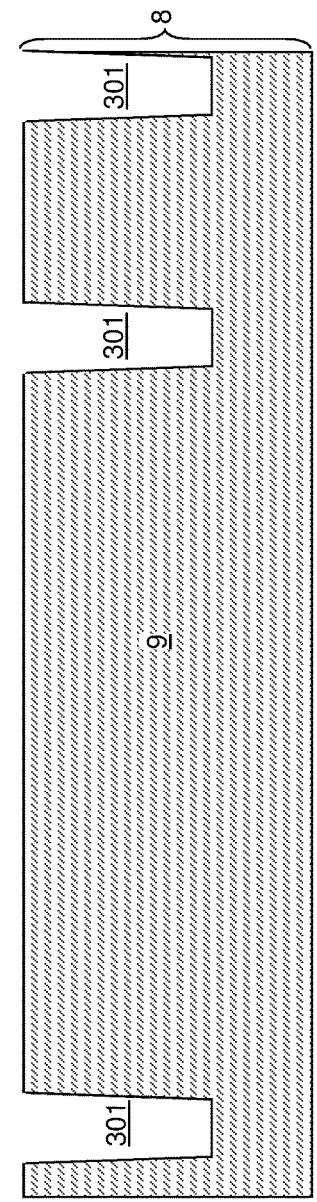
FIG. 1B is a vertical cross-sectional view of the first exemplary structure along a vertical plane B-B' of FIG. 1A.

Referring to FIGS. 1A and 1B, a first exemplary structure according to an embodiment of the present disclosure is illustrated, which includes a first semiconductor substrate 8, such as silicon wafer. The first semiconductor substrate 8 includes a first substrate semiconductor layer 9 composed of a semiconductor material such as silicon. The first substrate semiconductor layer 9 can be an upper part of the first semiconductor substrate 8, a doped well in the upper part of the first semiconductor substrate 8 and/or a semiconductor layer (e.g., an epitaxial silicon layer) located on the front side of the first semiconductor substrate 8. A photoresist layer (not shown) is applied over the top surface of the first semiconductor substrate 8, and is lithographically patterned to form openings therein. The openings in the photoresist layer can be discrete openings having a maximum lateral dimension in a range from 300 nm to 30,000 nm, such as from 1,000 nm to 10,000 nm, although lesser and greater maximum lateral dimensions can also be employed. In an illustrative example, the openings in the photoresist layer can have a circular shape or an elliptical shape. An anisotropic etch process is performed to transfer the pattern of the openings in the photoresist layer into an upper portion of the first semiconductor substrate 8. Via openings 301 are formed through an upper portion of the first semiconductor substrate 8. The depth of the via openings 301 can be less than the thickness of the first substrate semiconductor layer 9. For example, the depth of the via openings 301 can be in a range from 30 microns to 600 microns, although lesser and greater depths can also be employed. In one embodiment, the via openings 301 can be formed as an array of discrete via openings. In one embodiment, the via openings 301 can be formed with a non-zero taper angle with respect to the vertical direction that is perpendicular to the top surface of the first substrate semiconductor layer 9. Thus, each via opening 301 can be wider at a top portion than at a bottom portion. Correspondingly, the maximum lateral dimension of a via opening 301 at a top portion can be greater than the maximum lateral dimension of the via opening 301 at a bottom portion.

Figure 2:
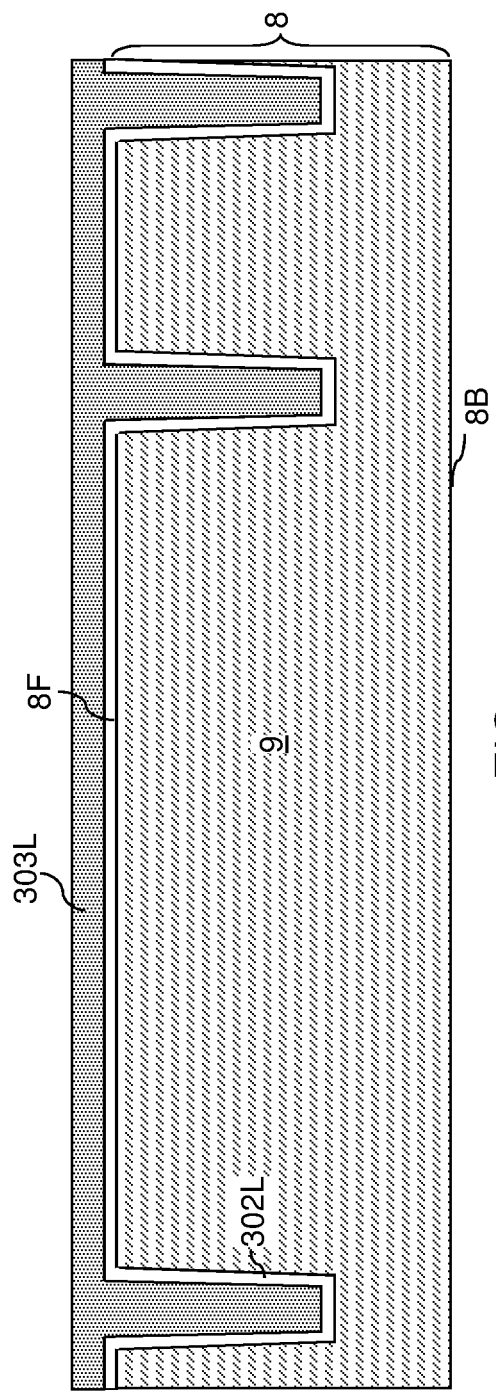
FIG. 2 is a vertical cross-sectional view of the first exemplary structure after formation of an insulating material liner and a sacrificial material layer according to an embodiment of the present disclosure.

Referring to FIG. 2, an insulating material liner layer 302L and a sacrificial material layer 303L are sequentially formed in the via openings 301. The insulating material liner layer 302L includes an electrically insulating material such as silicon oxide. The insulating material liner layer 302L can be formed by oxidation of surface portions of the first semiconductor substrate 8. For example, if the first semiconductor substrate 8 includes silicon, the insulating material liner layer 302L can include thermal silicon oxide that is substantially free of carbon and hydrogen. Alternatively, the insulating material liner layer 302L can by formed by a conformal deposition method such as low pressure chemical vapor deposition (LPCVD). The thickness of the insulating material liner layer 302L can be in a range from 50 nm to 500 nm, although lesser and greater thicknesses can also be employed. The sacrificial material layer 303L includes a material that can be removed selective to the materials of the insulating material liner layer 302L and the first substrate semiconductor layer 9. For example, the sacrificial material layer 303L can include silicon nitride, germanium, a silicon-germanium alloy with a high percentage of germanium (such as more than 50%), organosilicate glass, or a polymer. Cavities may, or may not, be formed within volumes of the via openings 301 after deposition of the sacrificial material layer 303L.

Figure 3:
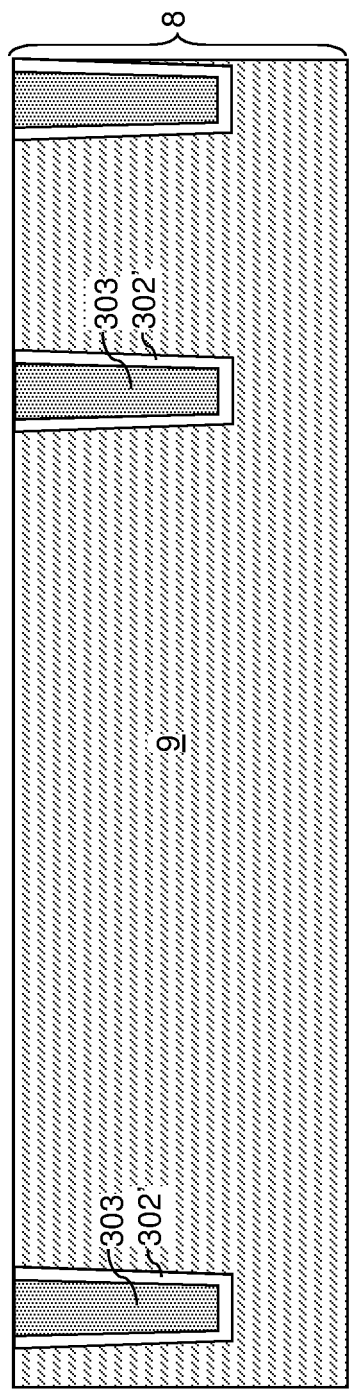
FIG. 3 is a vertical cross-sectional view of the first exemplary structure after formation of sacrificial pillar structures according to an embodiment of the present disclosure.

Referring to FIG. 3, the sacrificial material of the sacrificial material layer 303L and the insulating material of the insulating material liner layer 302L are planarized such that excess portions of the sacrificial material layer 303L and the insulating material liner layer 302L that overlie the top surface of the first substrate semiconductor layer 9 are removed. A chemical mechanical planarization (CMP) process and/or a recess etch process may be employed to remove the excess portions of the sacrificial material layer 303L and the insulating material liner layer 302L. Each remaining portion of the sacrificial material layer 303L constitutes a sacrificial pillar structure 303. In one embodiment, each sacrificial pillar structure 303 can have a tapered sidewall such that a horizontal cross-sectional shape of the sacrificial pillar structure 303 decreases with a vertical distance from the top surface of the first substrate semiconductor layer 9. Each remaining portion of the insulating material liner layer 302L constitutes an insulating material liner 302'.

Generally, the sacrificial pillar structures 303 are formed within an upper portion of the first semiconductor substrate 8 such that the sacrificial pillar structures 303 extend from the front side surface 8F of the first semiconductor substrate 8 toward, but not all the way to, an in-process backside surface 8B of the first semiconductor substrate 8. As described below, the first semiconductor substrate 8 is subsequently thinned from the backside such that in-process backside surface of the first semiconductor substrate 8 is removed and a new backside surface of the first semiconductor substrate 8 is formed at a location more proximal to the front side of the first semiconductor substrate 8.

Figure 4:
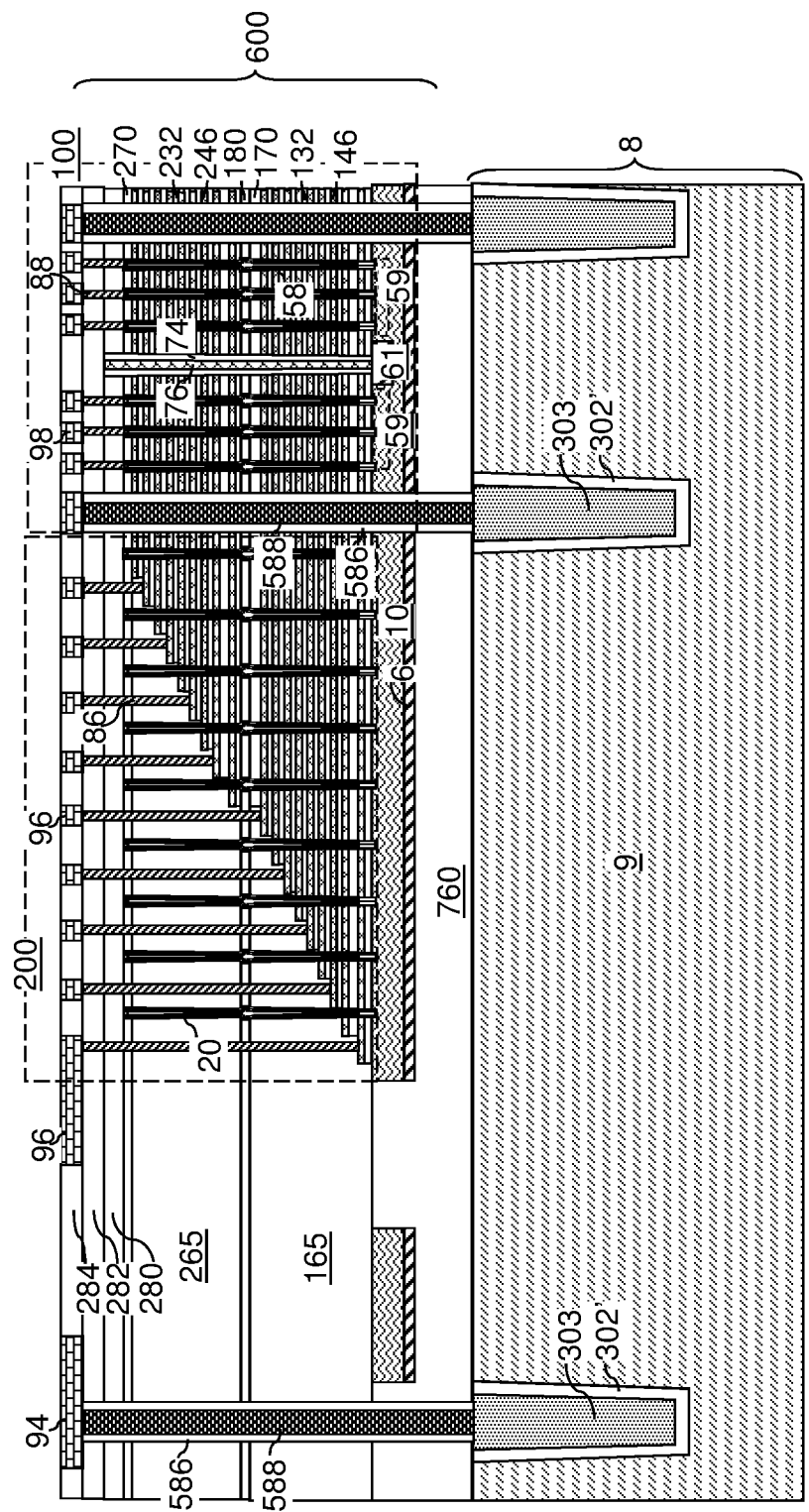
FIG. 4 is a vertical cross-sectional view of the first exemplary structure after formation of first semiconductor devices including a three-dimensional memory device according to an embodiment of the present disclosure.

Referring to FIG. 4, first semiconductor devices 600 are formed on the front side surface of the first semiconductor substrate 8. In one embodiment, the first semiconductor devices 600 can include a three-dimensional memory device, such as a three-dimensional NAND memory device. The three-dimensional memory device can include an alternating stack of insulating layers (132, 232) and electrically conductive layers (146, 246) and a two-dimensional array of memory stack structures 58 including a respective vertical stack of memory elements located at levels of the electrically conductive layers. Two tiers of alternating stacks are shown in the example of FIG. 4. However, one tier or more than two tiers can be formed instead.

An insulating material layer 760 including an insulating material such as silicon oxide can be formed over the first substrate semiconductor layer 9. A patterned stack of a metal layer 6 and semiconductor material layer 10 can be formed above the insulating material layer 760. Gaps between patterned portions of the semiconductor material layer 10 can be filled with an insulating material.

At least one alternating stack of insulating layers and sacrificial material layers can be formed with stepped surfaces. For example, a first alternating stack of first insulating layers 132 and first sacrificial material layers can be deposited and patterned to form first stepped surfaces. A first insulating cap layer 170 can be optionally formed over the first alternating stack prior to patterning the first stepped surfaces. A first retro-stepped dielectric material portion 165 can be formed on the first stepped surfaces. An inter-tier dielectric layer 180 can be formed above the first alternating stack and the first retro-stepped dielectric material portion 165. First-tier memory openings can be formed through the first alternating stack by a combination of a lithographic patterning process and a first anisotropic etch process. First-tier memory opening fill structures and first-tier support opening fill structures can be formed in the first-tier memory opening and the first-tier support openings as sacrificial structures.

A second alternating stack of second insulating layers 232 and second sacrificial material layers can be deposited and patterned to form second stepped surfaces. A second insulating cap layer 270 can be optionally formed over the second alternating stack prior to patterning the second stepped surfaces. A second retro-stepped dielectric material portion 265 can be formed on the second stepped surfaces. Second-tier memory openings can second-tier support openings can be formed through the second alternating stack by a combination of a lithographic patterning process and a second anisotropic etch process. The second-tier memory openings can directly overlie the first-tier memory opening fill structures and the first-tier support opening fill structures. Inter-tier memory openings and inter-tier support openings can be formed by removing the first-tier memory opening fill structures and the first-tier support opening fill structures underneath the second-tier memory openings.

A series of processing steps can be sequentially performed to simultaneously form a memory stack structure 58 within each inter-tier memory opening and a support pillar structure 20 within each inter-tier support opening. Each of the memory stack structures 58 and the support pillar structures 20 can include, from outside to inside, a blocking dielectric layer, a charge storage layer, a tunneling dielectric layer, and a vertical semiconductor channel. An anisotropic etch can be performed to form openings through bottom portions of the tunneling dielectric layer, the charge storage layer, and the blocking dielectric layer prior to formation of the vertical semiconductor channel. Thus, the vertical semiconductor channel can contact the semiconductor material layer 10. A surface portion of the semiconductor material layer 10 adjoined to the vertical semiconductor channels can constitute a horizontal semiconductor channel 59. A drain region (not explicitly shown) can be formed at an upper portion of each vertical semiconductor channel.

A first contact level dielectric layer 280 can be formed over the second insulating cap layer 270. Backside trenches can be formed through the first and second alternating stacks by a combination of a lithographic process and an anisotropic etch process. The first and second sacrificial material layers (which include a sacrificial material such as silicon nitride) can be removed selective to the first and second insulating layers (132, 232), and can be replaced with first electrically conductive layers 146 and second electrically conductive layers 246, respectively. The memory stack structures 58 and the support pillar structures 20 provide structural support while the first and second sacrificial layers are removed from the first and second alternating stacks. Source regions 61 can be formed in upper portions of the semiconductor material layer 10 that underlie the backside trenches. An insulating spacer 74 and a backside contact via structure 76 can be formed within each backside trench to provide electrical contact to the source regions 61.

A second contact level dielectric layer 282 can be deposited over the first contact level dielectric layer 280. Contact via structures can be subsequently formed. The contact via structures can include, for example, drain contact via structures 88 that provide electrical contact to the drain regions located in an upper portion of each memory stack structure 58, and word line contact via structures 86 contacting a top surface of a respective one of the first and second electrically conductive layers (146, 246). The first and second electrically conductive layers (146, 246) comprise word lines/control gate electrodes of the three-dimensional NAND memory device.

Through-memory-level via cavities can be formed through the first and second contact level dielectric layers (282, 280), through the second alternating stack (232, 246), the first alternating stack (132, 146), the second retro-stepped dielectric material portion 265, and/or the first retro-stepped dielectric material portion 165, and through the insulating material layer 760 to a top surface of a respective one of the sacrificial pillar structures 303. An insulating spacer material layer can be conformally deposited and anisotropically etched to form an insulating spacer 586 having a tubular configuration at a periphery of each through-memory-level via cavity. At least one conductive material, such as a combination of a metallic liner and a metal fill material (e.g., tungsten) can be deposited in remaining volumes of the through-memory-level via cavities to form through-memory-level via structures 588. Each through-memory-level via structure 588 can contact a top surface of a respective one of the sacrificial pillar structures 303. The through-memory-level via cavities can be formed before or after formation of the electrically conductive layers (146, 246). For example, the cavities can be formed before formation of the electrically conductive layers (146, 246) and filled with a sacrificial or insulating material before formation of the through-memory-level via structure 588. Alternatively, the cavities can be formed through insulating pillars extending through the alternating stacks after formation of the electrically conductive layers (146, 246).

A line level dielectric layer 284 can be formed above the second contact level dielectric layer 282. Various metal structures (98, 96, 94) can be formed within the line level dielectric layer 284, which can include bit lines 98 electrically connected through the drain contact via structures 88 to the drain regions of vertical field effect transistors located within the memory stack structures 58, interconnection metal lines 96 that provide electrical connection to the word line contact via structures 86 and to the first and second electrically conductive layers (146, 246), and interconnection metal pads 94 that contact top surfaces of the through-memory-level via structures 588. The region in which the word line contact via structures 86 are formed is herein referred to as a contact region 200. The three-dimensional array of memory elements includes portions of charge storage layers within the memory stack structures 58 that are located at levels of the first and second electrically conductive layers (146, 246).

Figure 5:
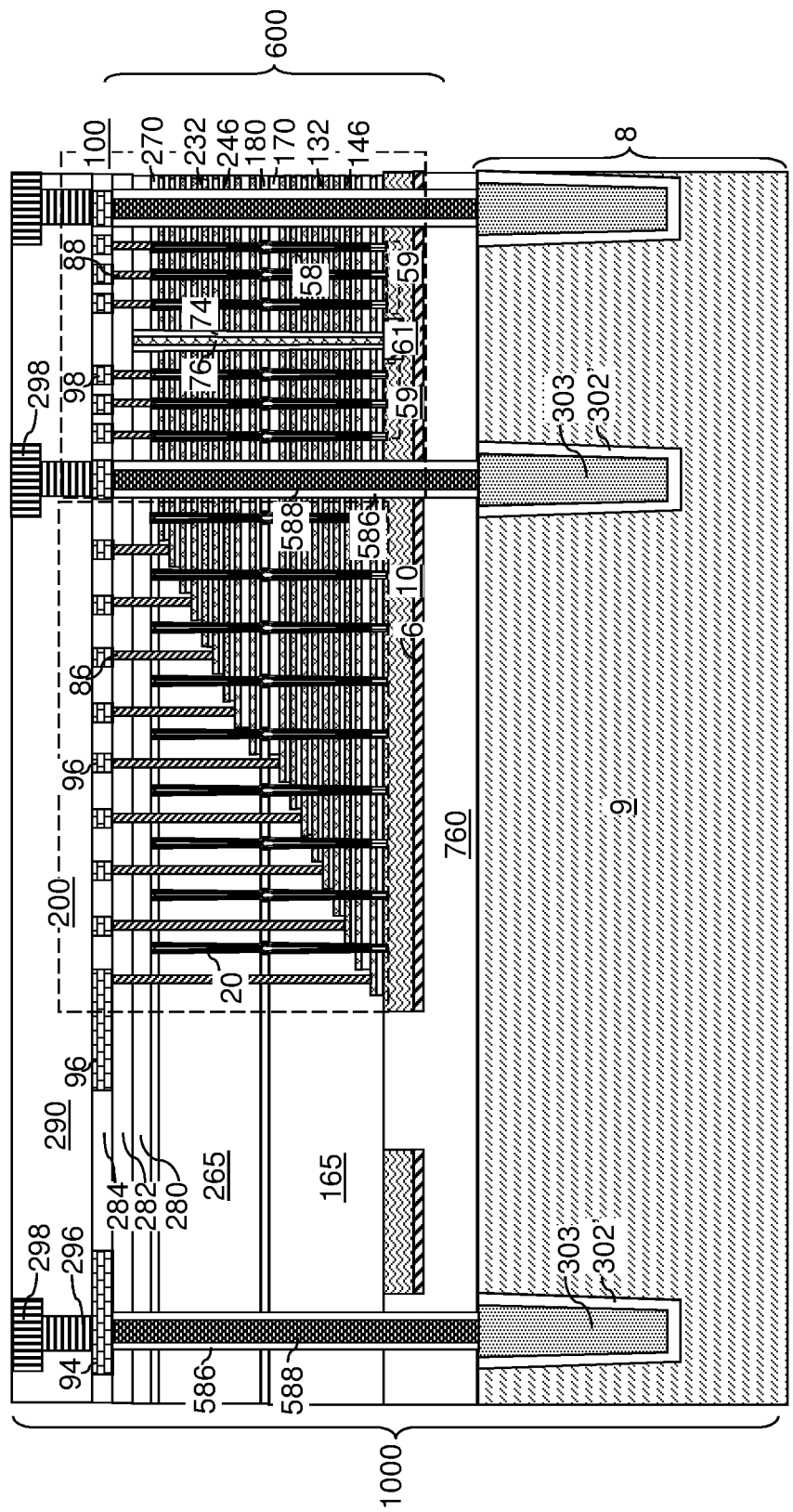
FIG. 5 is a vertical cross-sectional view of the first exemplary structure after formation of front side bonding pad structures on a first semiconductor chip according to an embodiment of the present disclosure.

Referring to FIG. 5, additional interconnect level dielectric layers 290 and additional metal interconnect structures can be formed over the line level dielectric layer 284. The additional metal interconnect structures can include bonding pad connection via structures 296 and front side bonding pad structures 298. In one embodiment, the front side bonding pad structures 298 can include, and/or consist essentially of, copper. A first semiconductor chip 1000 is provided at this processing step. The first semiconductor chip 1000 can be formed as a die on the first semiconductor substrate 8 as part of a two-dimensional array of dies. Alternatively, the first semiconductor chip 1000 can be diced from the first semiconductor substrate 8 as a singulated semiconductor chip. The front side of the first semiconductor chip is the side of the three-dimensional NAND memory device, and the back side of the first semiconductor chip 1000 is the opposite side (e.g., the back side of the first semiconductor substrate 8 containing the bonding pad structures 318).

Figure 6:
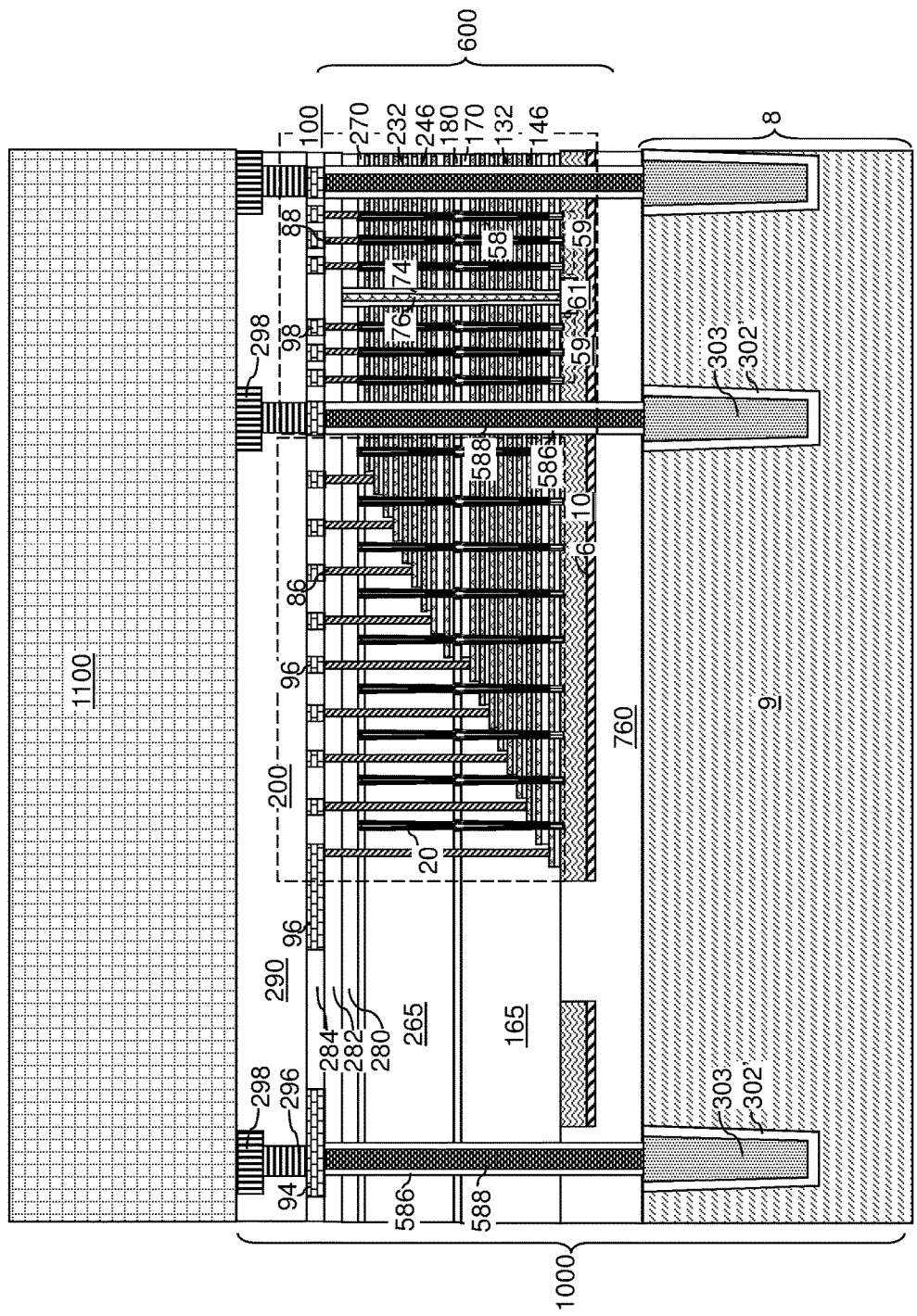
FIG. 6 is a vertical cross-sectional view of the first exemplary structure after attaching a first front side handle substrate to the first semiconductor chip according to an embodiment of the present disclosure.

Referring to FIG. 6, a first front side handle substrate 1100 can be attached to the front side of the first semiconductor chip 1000. The first front side handle substrate 1100 can have a thickness in a range from 0.5 mm to 3 mm, although lesser and greater thicknesses can also be employed. The first front side handle substrate 1100 can include any rigid material, which may be an insulating material, a semiconducting material, or a conductive material. The first front side handle substrate 1100 can be attached to the first semiconductor chip 1000 by an adhesive layer (not expressly shown) or by any other suitable temporary bonding material.

Figure 7:
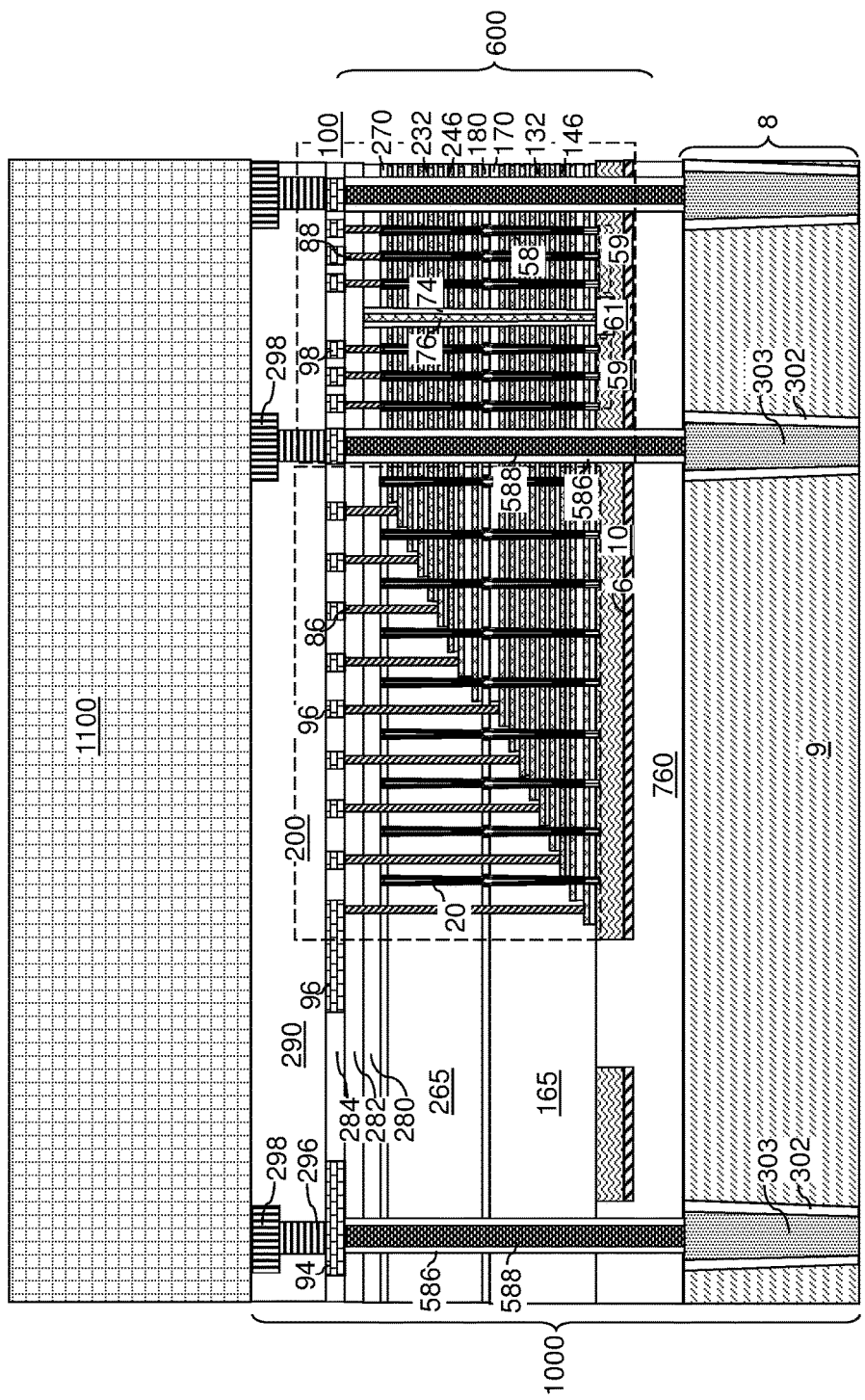
FIG. 7 is a vertical cross-sectional view of the first exemplary structure after thinning the first semiconductor substrate according to an embodiment of the present disclosure.

Referring to FIG. 7, the first semiconductor substrate 8 can be thinned from the backside. Specifically, the material of the first semiconductor substrate 8 can be removed from above the in-process backside surface (i.e., the initial backside surface) of the first semiconductor substrate 8 by grinding, polishing, and/or etching. The first front side handle substrate 1100 provides structural support during the thinning of the first semiconductor substrate 8. The first semiconductor substrate 8 can be thinned until the backside surfaces of the sacrificial pillar structures 303 are physically exposed. The bottom horizontal portions of the insulating material liners 302' are removed during thinning of the first semiconductor substrate 8. Each remaining portion of the insulating material liners 302' can have a tubular configuration, and is herein referred to as a tubular insulating spacer 302. A new backside surface of the first semiconductor substrate 8 is provided after thinning the first semiconductor substrate 8. In one embodiment, the backside surfaces of the sacrificial pillar structures 303, the backside surfaces of the insulating material liners 302, and the backside surface of the first semiconductor substrate 8 can be formed within a same horizontal plane.

Figure 8:
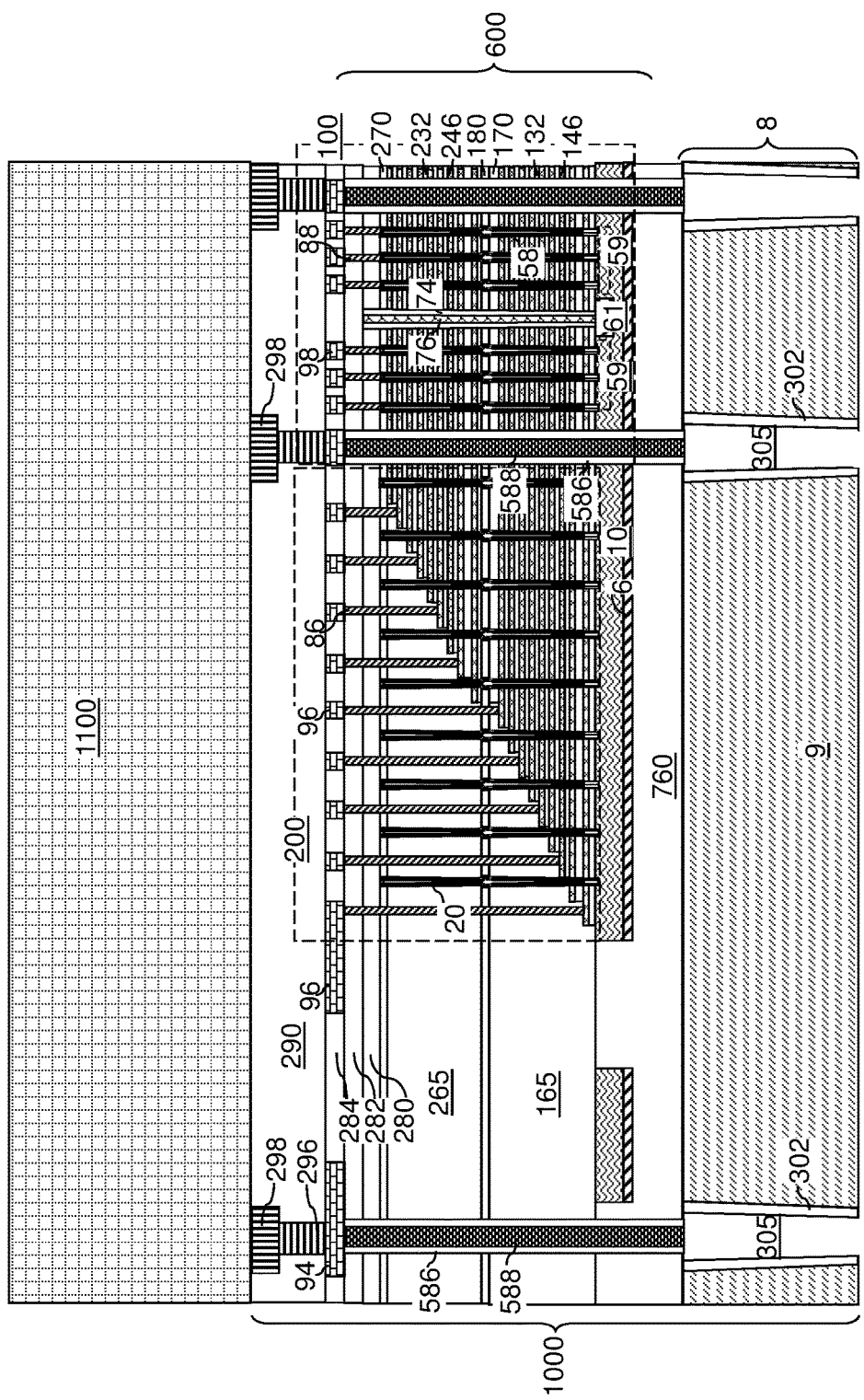
FIG. 8 is a vertical cross-sectional view of the first exemplary structure after removal of the sacrificial pillar structures according to an embodiment of the present disclosure.

Referring to FIG. 8, the sacrificial pillar structures 303 can be removed selective to the materials of the tubular insulating spacers 302 and the first substrate semiconductor layer 9. For example, if the tubular insulating spacers 302 include silicon oxide and if the sacrificial pillar structures 303 include silicon nitride, a wet etch employing hot phosphoric acid can be performed to remove the sacrificial pillar structures 303 selective to the insulating material liners 302 and the first substrate semiconductor layer 9. Through-substrate cavities 305 are formed in volumes formed by removing the sacrificial pillar structures 303.

While the present disclosure is described employing an embodiment in which bottom surfaces of the through-memory-level via structures 588 are physically exposed above each through-substrate cavity 305, embodiments are expressly contemplated herein in which any other type of metal interconnect structures (such as metal lines, metal via structures, and/or metal plates) are physically exposed above at least one through-substrate cavity 305.

Figure 9:
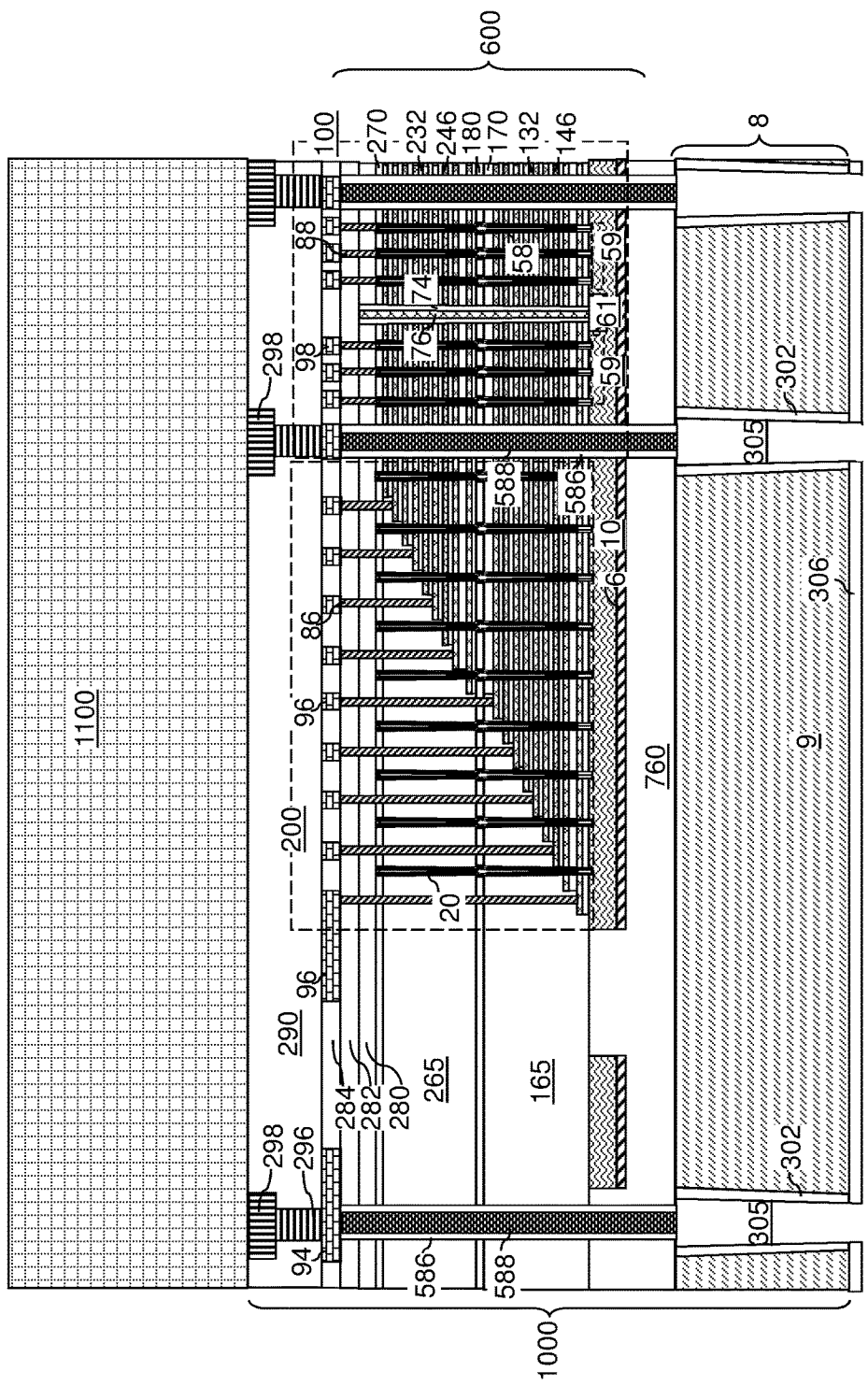
FIG. 9 is a vertical cross-sectional view of the first exemplary structure after formation of a backside insulating layer according to an embodiment of the present disclosure.

Referring to FIG. 9, an insulating material is anisotropically deposited on the backside surface of the first semiconductor substrate 8. In this case, the first exemplary structure can be placed in a deposition chamber upside down, and a depletive deposition process may be employed as the anisotropic deposition process. In a depletive deposition process, more material is deposited on horizontal surfaces that are proximal to a reactant stream within the deposition chamber than on vertical surfaces or on recessed surfaces that are distal from the reactant stream. Thus, more insulating material is deposited on the horizontal backside surface of the first substrate semiconductor layer 9 than on sidewalls of the tubular insulating spacers 302 or on the physically exposed surfaces of the through-memory-level via structures 588. For example, plasma enhanced physical deposition (PECVD) process can be used to deposit the insulating material.

In one embodiment, chemical vapor deposition (CVD) of silicon oxide by decomposition of tetraethylorthosilicate (TEOS) can be used to deposit the insulating material. The CVD silicon oxide includes carbon and hydrogen at atomic concentrations greater than 1 part per million. Thus, the deposited insulating material has a greater thickness on the backside surface of the first semiconductor substrate 8 than at horizontal surfaces of metal interconnect structures (such as the through-memory-level via structures 588) that are physically exposed above the through-substrate cavities 305. An optional isotropic etch back process (such as a wet etch process employing dilute hydrofluoric acid) can be subsequently performed to remove any residual portion of the deposited insulating material from the surfaces of the through-memory-level via structures 588. Horizontal surfaces of the metal interconnect structures (such as the through-memory-level via structures 588) are physically exposed after the silicon oxide deposition and/or after the optional isotropic etch back process. The remaining horizontal portion of the insulating material constitutes a backside insulating layer 306. The thickness of the backside insulating layer 306 can be in a range from 50 nm to 500 nm, although lesser and greater thicknesses can also be employed.

Figure 10:
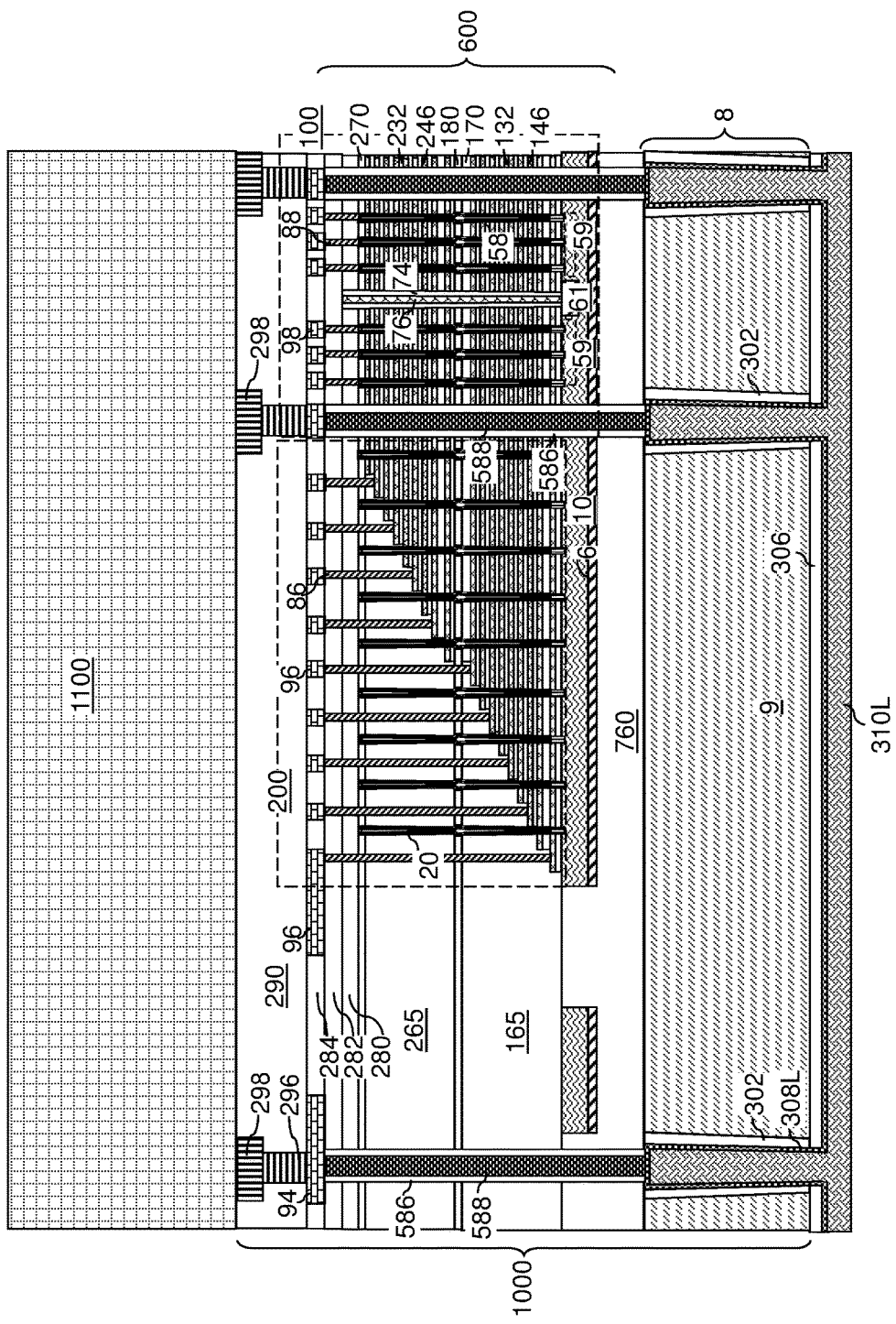
FIG. 10 is a vertical cross-sectional view of the first exemplary structure after formation of a metallic liner and a metal fill material layer according to an embodiment of the present disclosure.

Referring to FIG. 10, a metallic liner 308L and a metal fill material layer 310L can be sequentially deposited in the through-substrate cavities 305 and over the backside surface (i.e., over the backside insulating layer 306) of the first semiconductor substrate 8. The metallic liner 308L includes any suitable diffusion barrier material, such as a metal (e.g., Ti or Ta), a metal alloy (e.g., Co(W,P)) and/or a conductive metallic nitride material (such as titanium nitride or tantalum nitride), and is formed on sidewalls of the through-substrate cavities 305. The metallic liner 308L can be deposited by a conformal deposition process such as a low pressure chemical vapor deposition (LPCVD) process. The metal fill material layer 310L includes a metal fill material such as copper or tungsten. The metal fill material layer 310L can be deposited on the metallic liner 308L in remaining volumes of the through-substrate cavities 305.

Figure 11:
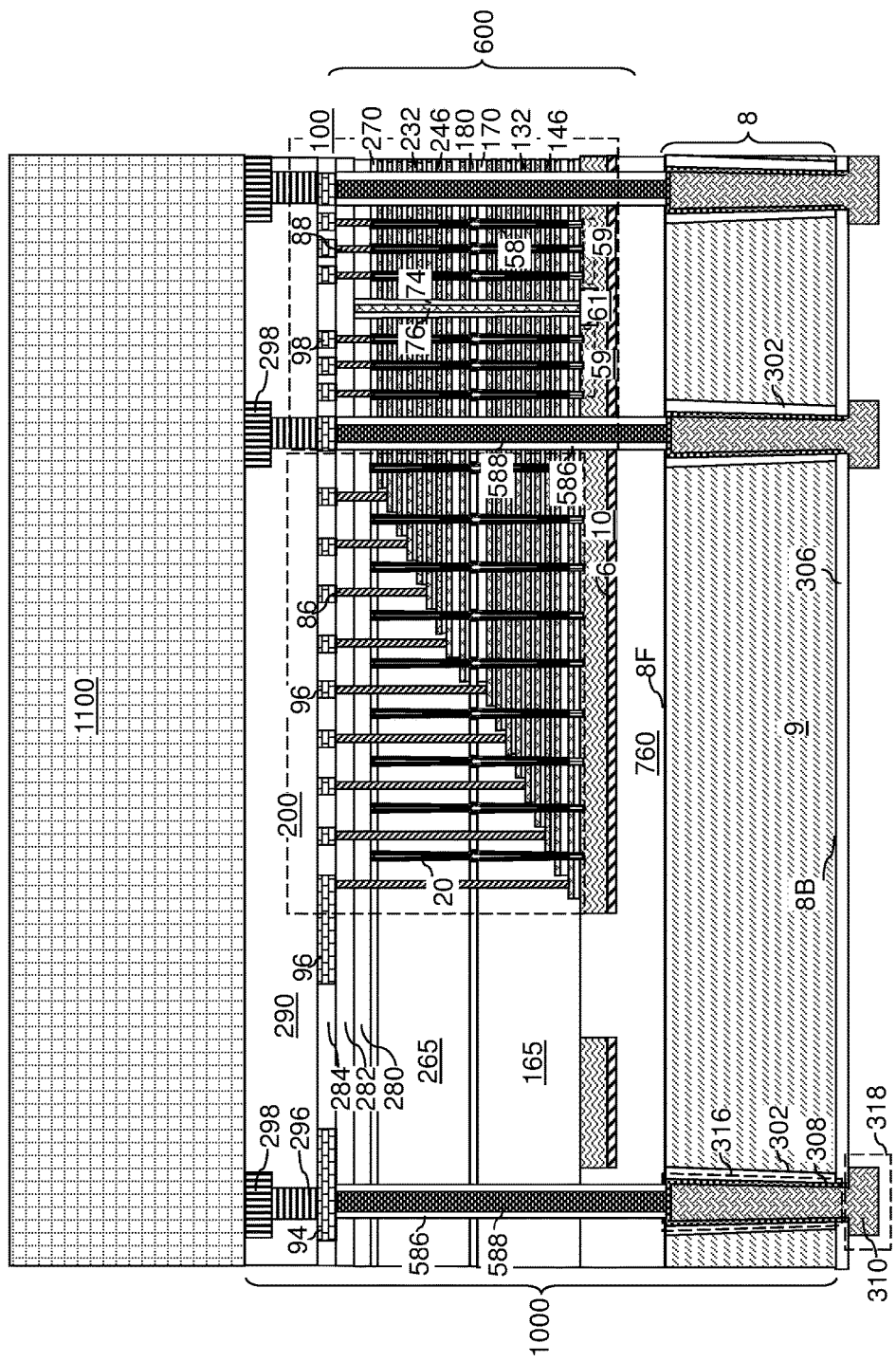
FIG. 11 is a vertical cross-sectional view of the first exemplary structure after patterning the metallic liner and the metal fill material layer into first integrated through-substrate via and pad structures according to an embodiment of the present disclosure.

Referring to FIG. 11, the metallic liner 308L and the metal fill material layer 310L can be patterned into first through-substrate via structures 316 by chemical mechanical planarization (e.g., polishing) from the back side of the first semiconductor substrate 8. Optionally first bonding pad structures 318 can be formed on the exposed portions of the first through-substrate via structures 316 that are exposed through layer 306 on the back side of the first semiconductor substrate 8. For example, the first bonding pad structures 318 can be formed by selective deposition, such as by selective electroplating or electroless plating of copper on the first through-substrate via structures 316 to form first integrated through-substrate via and pad structures (318, 316). Alternatively, the first bonding pad structures 318 can be omitted, and bonding pad structures from a second substrate can directly contact the first through-substrate via structures 316 after formation of a bonded structure.

Each first integrated through-substrate via and pad structure (318, 316) includes a backside bonding pad structure 318 and a first through-substrate via structure 316. The first bonding pad structures 318 protrude from the horizontal plane including the top surface of the backside insulating layer 306. The first through-substrate via structure 316 includes vertically extending portions of the metallic liner 308L and the metal fill material layer 310L that are embedded within the first semiconductor substrate 8 and the backside insulating layer 306. The backside bonding pad structure 318, which are also referred to as backside bonding pad structures 318, can be physically exposed on the backside of the first semiconductor chip 1000. Each first integrated through-substrate via and pad structure (318, 316) includes a patterned portion of the metallic liner 308L, which is herein referred to as a metallic liner 308, and a patterned portion of the metal fill material layer 310L and any selectively grown bonding pad material thereon, which are herein referred to as a metallic fill material portion 310.

Figure 12:
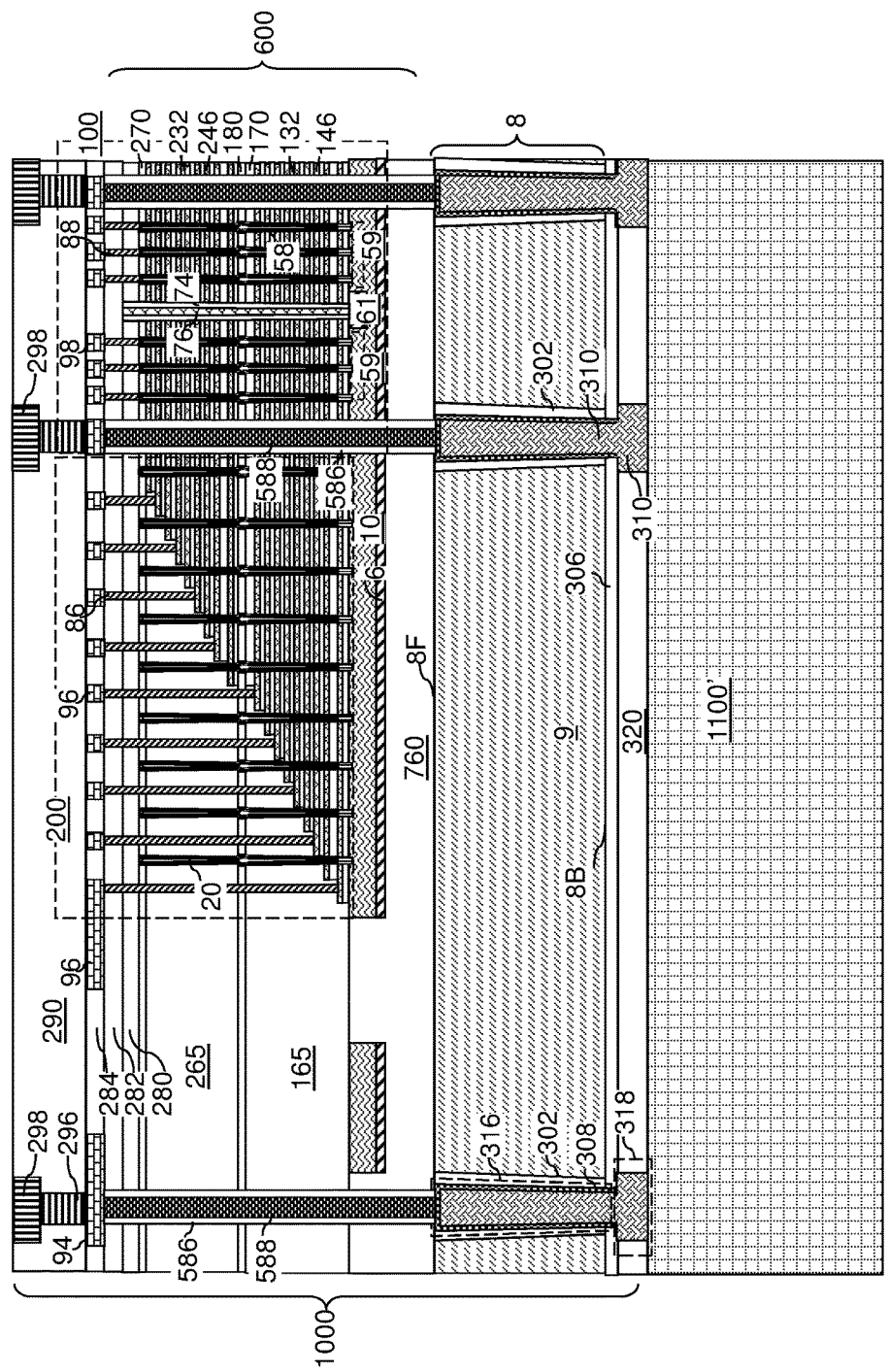
FIG. 12 is a vertical cross-sectional view of an optional derivative of the first exemplary structure after attaching a first back-side handle substrate and removing the first front side handle substrate according to an embodiment of the present disclosure.

Referring to FIG. 12, an optional derivative of the first exemplary structure is illustrated, which can be derived from the first exemplary structure of FIG. 11 by forming a pad level dielectric layer 320 on the backside insulating layer 306. The pad level dielectric layer 320 includes a planarizable dielectric material such as silicon oxide. The pad level dielectric layer 320 can be deposited, for example, by chemical vapor deposition or spin-coating, and can be planarized such that the top surface (in an upside down position) of the pad level dielectric layer 320 is coplanar with the top surface of the first integrated through-substrate via and pad structures (318, 316).

A first back-side handle substrate 1100' can be attached to the physically exposed surface of the pad level dielectric layer 320 and/or to the physically exposed surfaces of the first integrated through-substrate via and pad structures (318, 316) employing an adhesive material layer or by any other suitable bonding methods. The first front side handle substrate 1100, can be detached from the front side surface of the first semiconductor chip 1000. A suitable surface clean process can be performed to remove residual adhesive materials from the top surface of the additional interconnect level dielectric layers 290. In this case, the front side bonding pad structures 298 can be physically exposed on the front side of the first semiconductor chip 1000.

Generally, a first semiconductor chip 1000 is provided, which comprises a first semiconductor substrate 8, first semiconductor devices 600 located over a front side surface 8F of the first semiconductor substrate 8, and first integrated through-substrate via and pad structures (318, 316) that includes a respective first through-substrate via structure 316 and a respective backside bonding pad structure 318 and comprises a first metallic material. The first integrated through-substrate via and pad structures (318, 316) vertically extend from the front side surface 8F of the first semiconductor substrate 8 to a backside surface 8B of the first semiconductor substrate 8 and are electrically isolated from the first semiconductor substrate 8 by a respective tubular insulating spacer 302 and by a backside insulating layer 306 contacting the backside surface of the first semiconductor substrate 8. Each of the first integrated through-substrate via and pad structures (318, 316) has a greater lateral dimension within a horizontal plane including the front side surface of the first semiconductor substrate 8 than within a horizontal plane including the backside surface of the first semiconductor substrate 8. In one embodiment, the first semiconductor devices 600 comprise a three-dimensional memory device including an alternating stack of insulating layers (132, 232) and electrically conductive layers (146, 246) and a two-dimensional array of memory stack structures 58 including a respective vertical stack of memory elements located at levels of the electrically conductive layers (146, 246). First bonding pad structures (318 or 298) are electrically connected to a respective one of the first semiconductor devices.

Figure 13:
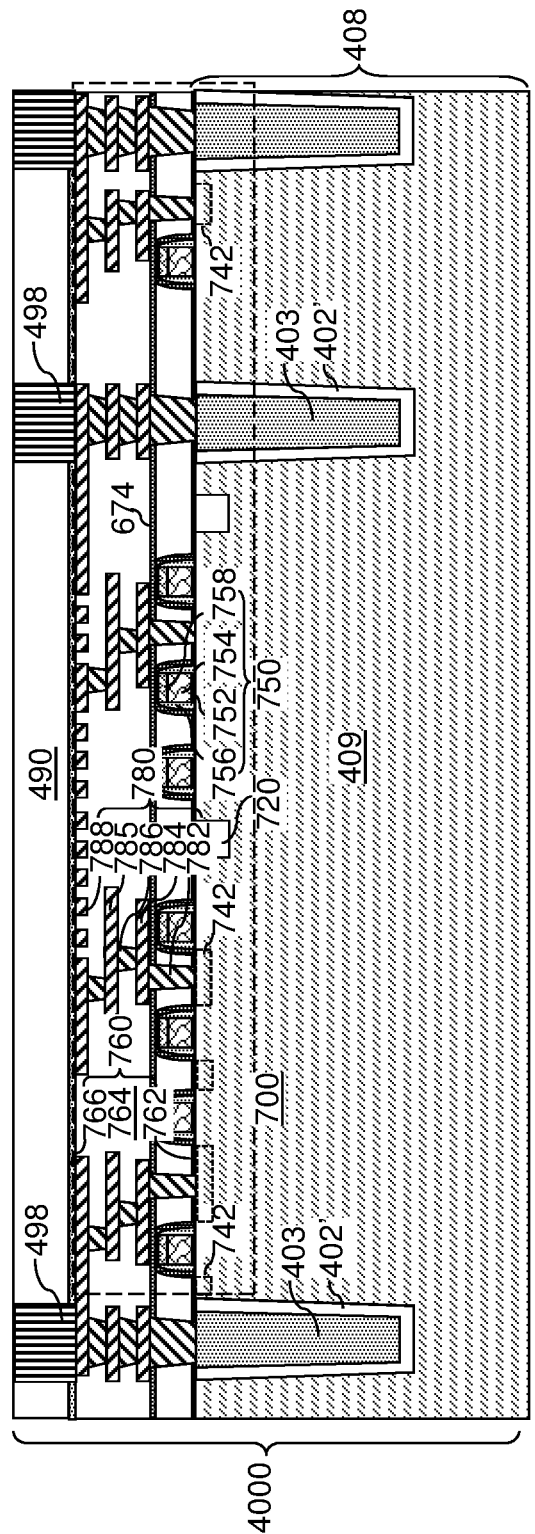
FIG. 13 is a vertical cross-sectional view of a second exemplary structure after forming sacrificial pillar structures, second semiconductor devices, and front side bonding pad structures according to an embodiment of the present disclosure.

Referring to FIG. 13, a second exemplary structure according to an embodiment of the present disclosure is illustrated. The second exemplary structure includes through-substrate via structures in a substrate supporting peripheral devices. The second exemplary structure can be provided employing the processing steps of FIGS. 1A and 1B, 2, and 3. The second exemplary structure comprises a second semiconductor substrate 408 (e.g., silicon wafer) including a second substrate semiconductor layer 409 (e.g., doped well and/or epitaxial silicon layer), insulating material liners 402', and sacrificial pillar structures 403. The insulating material liners 402' in the second exemplary structure can have the same compositional and structural characteristics as the insulating material liners 302' in the first exemplary structure. The sacrificial pillar structures 403 in the second exemplary structure can have the same compositional and structural characteristics as the sacrificial pillar structures 303 in the first exemplary structure.

Semiconductor devices, which are herein referred to as second semiconductor devices 700, are formed on the second substrate semiconductor 409. In one embodiment, the second semiconductor devices comprise peripheral devices that provide control signals for operation of the two-dimensional array of memory stack structures in the first semiconductor chip 1000.

In an illustrative example, shallow trench isolation structures 720 can be formed in an upper portion of the second substrate semiconductor layer 409 to provide electrical isolation among the semiconductor devices. The semiconductor devices 700 can include, for example, field effect transistors including respective transistor active regions 742 (i.e., source regions and drain regions), gate structures 750, and channel regions underlying the gate structures 750 and located between a respective pair of transistor active regions 742. Only a subset of the transistor active regions 742 are illustrated for clarity. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers 760 are formed over the semiconductor devices. The dielectric material layers 760 constitute a dielectric layer stack embedding metal interconnect structures 780. The dielectric material layers 760 can include, for example, a dielectric liner 762 such as a silicon liner that blocks diffusion of mobile ions and/or apply appropriate stress to underlying structures, interconnect level dielectric layers 764 that overlies the dielectric liner 762, and a passivation dielectric layer 766 (such as a silicon nitride layer) that functions as a diffusion barrier layer and overlies the interconnect level dielectric layer 764. Each dielectric material layer among the interconnect level dielectric layers 764 may include any of doped silicate glass, undoped silicate glass, organosilicate glass, silicon nitride, silicon oxynitride, and dielectric metal oxides (such as aluminum oxide). In one embodiment, each of the interconnect level dielectric layers 764 can comprise, or consist essentially of, dielectric material layers having dielectric constants that do not exceed the dielectric constant of undoped silicate glass (silicon oxide) of 3.9. The metal interconnect structures 780 can include various device contact via structures 782, intermediate metal line structures (784, 785), intermediate metal via structures 786, and topmost metal line structures 788.

A bonding pad level dielectric layer 490 overlies the dielectric material layers 760. Front side bonding pad structures 498 can be formed through the bonding pad level dielectric layer 490 and the passivation dielectric layer 766 directly on a respective one of the topmost metal line structures 788. In one embodiment, the front side bonding pad structures 498 can include, and/or consist essentially of, copper. A second semiconductor chip 4000 is provided at this processing step. The second semiconductor chip 4000 can be formed as a die on the second semiconductor substrate 408 as part of a two-dimensional array of dies. Alternatively, the second semiconductor chip 4000 can be diced from the second semiconductor substrate 408 as a singulated semiconductor chip.

Figure 14:
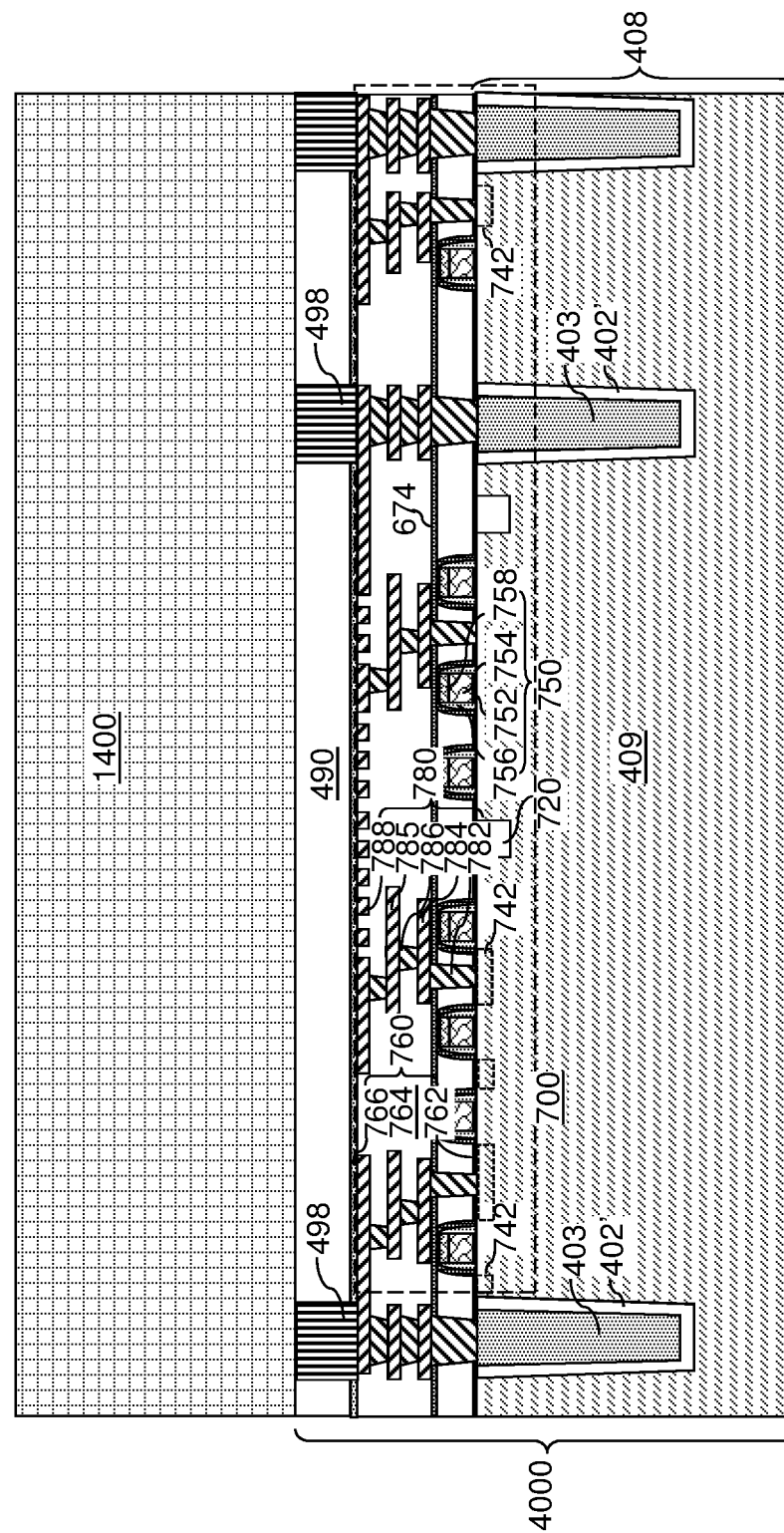
FIG. 14 is a vertical cross-sectional view of the second exemplary structure after attaching a second front side handle substrate to a second semiconductor chip according to an embodiment of the present disclosure.

Referring to FIG. 14, a second front side handle substrate 1400 can be attached to the front side of the second semiconductor chip 4000. The second front side handle substrate 1400 can have a thickness in a range from 0.5 mm to 3 mm, although lesser and greater thicknesses can also be employed. The second front side handle substrate 1400 can include any rigid material, which may be an insulating material, a semiconducting material, or a conductive material. The second front side handle substrate 1400 can be attached to the second semiconductor chip 4000 by an adhesive layer (not expressly shown) or by any other suitable temporary bonding material.

Figure 15:
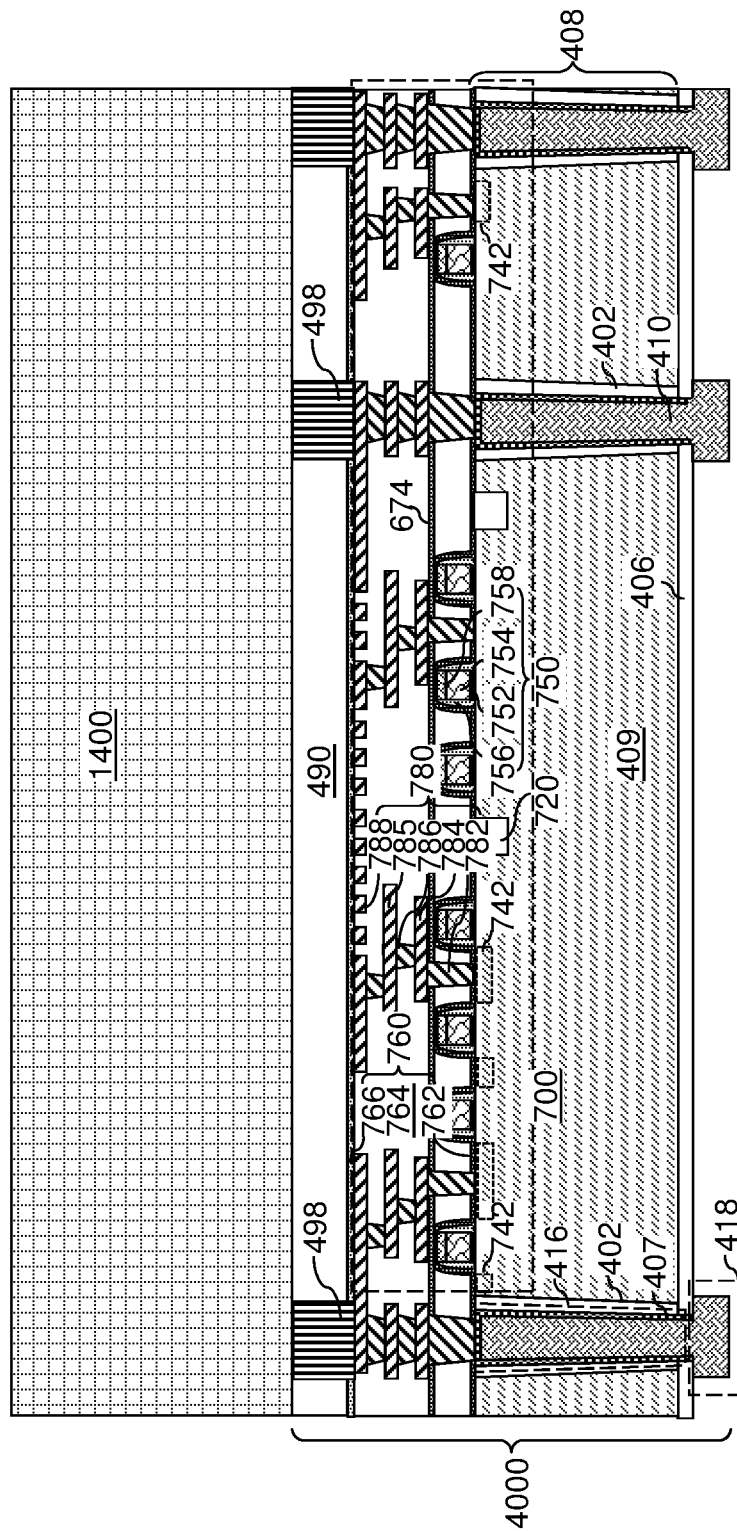
FIG. 15 is a vertical cross-sectional view of the second exemplary structure after formation of second integrated through-substrate via and pad structures according to an embodiment of the present disclosure.

Referring to FIG. 15, the processing steps of FIGS. 7-11 can be sequentially performed to thin the second semiconductor substrate 408 and to form tubular insulating spacers 302, to remove the sacrificial pillar structures 403 selective to the materials of the tubular insulating spacers 302 and the second substrate semiconductor layer 409, to form a backside insulating layer 406 (which can be compositionally and structurally the same as the backside insulating layer 306 in the first exemplary structure), and to form second through-substrate via structures 416 or second integrated through-substrate via and pad structures (418, 416).

Each second integrated through-substrate via and pad structure (418, 416) includes a second bonding pad structure 418 and a second through-substrate via structure 416. The first bonding pad structures 418 protrude from the horizontal plane including the top surface of the backside insulating layer 406. The second through-substrate via structure 416 includes vertically extending portions of the metallic liner and the metal fill material layer that are embedded within the second semiconductor substrate 408 and the backside insulating layer 406. The second bonding pad structure 418, which are also referred to as backside bonding pad structures 418, can be physically exposed on the backside of the second semiconductor chip 1400. Each second integrated through-substrate via and pad structure (418, 416) includes a patterned portion of the metallic liner, which is herein referred to as a metallic liner 407, and a patterned portion of a metal fill material layer and any optional deposited bonding pad metal, which are herein referred to as a metallic fill material portion 410.

Figure 16A:
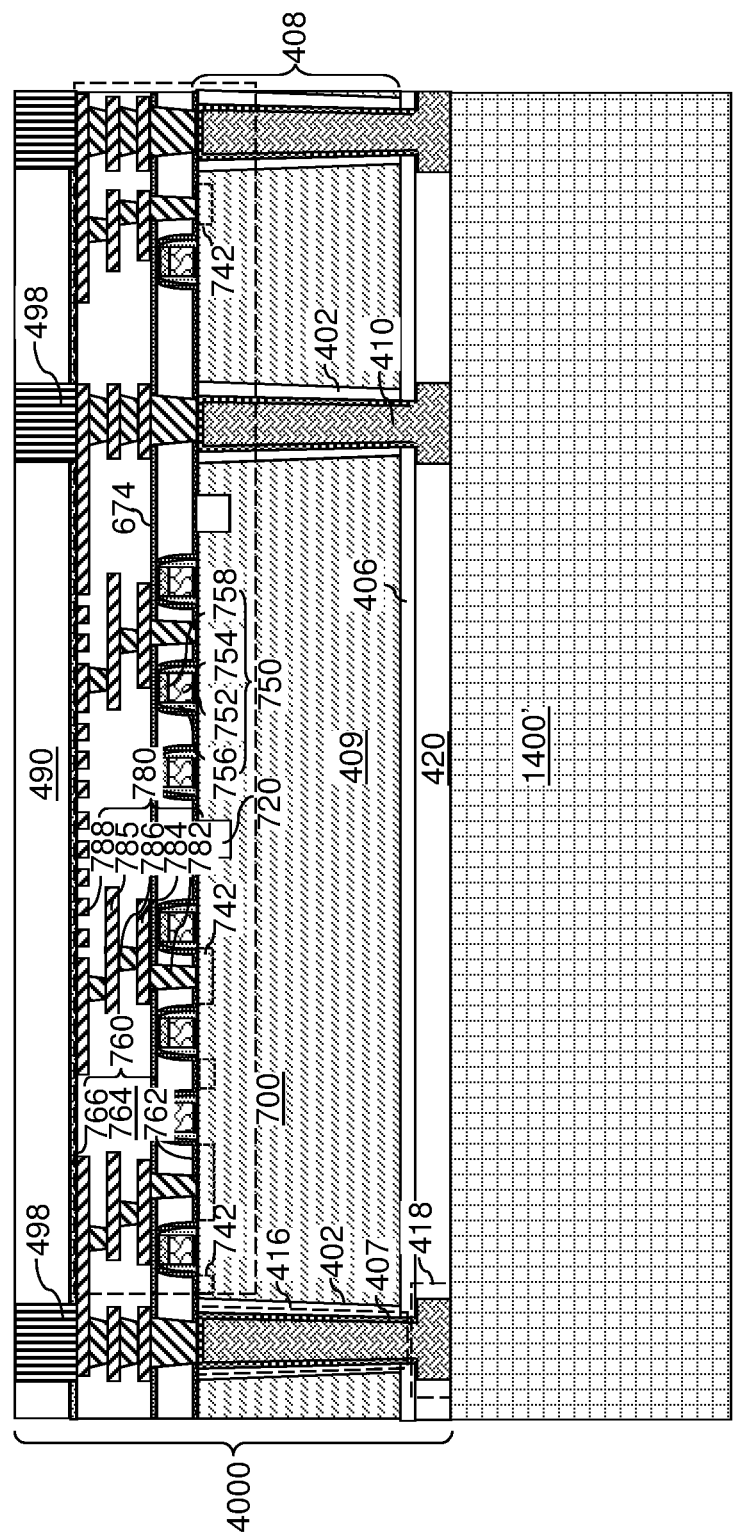
FIGS. 16A and 16B are vertical cross-sectional views of an optional derivatives of the second exemplary structure after attaching a second back-side handle substrate and removing the second front side handle substrate according to embodiments of the present disclosure.
Figure 16B:
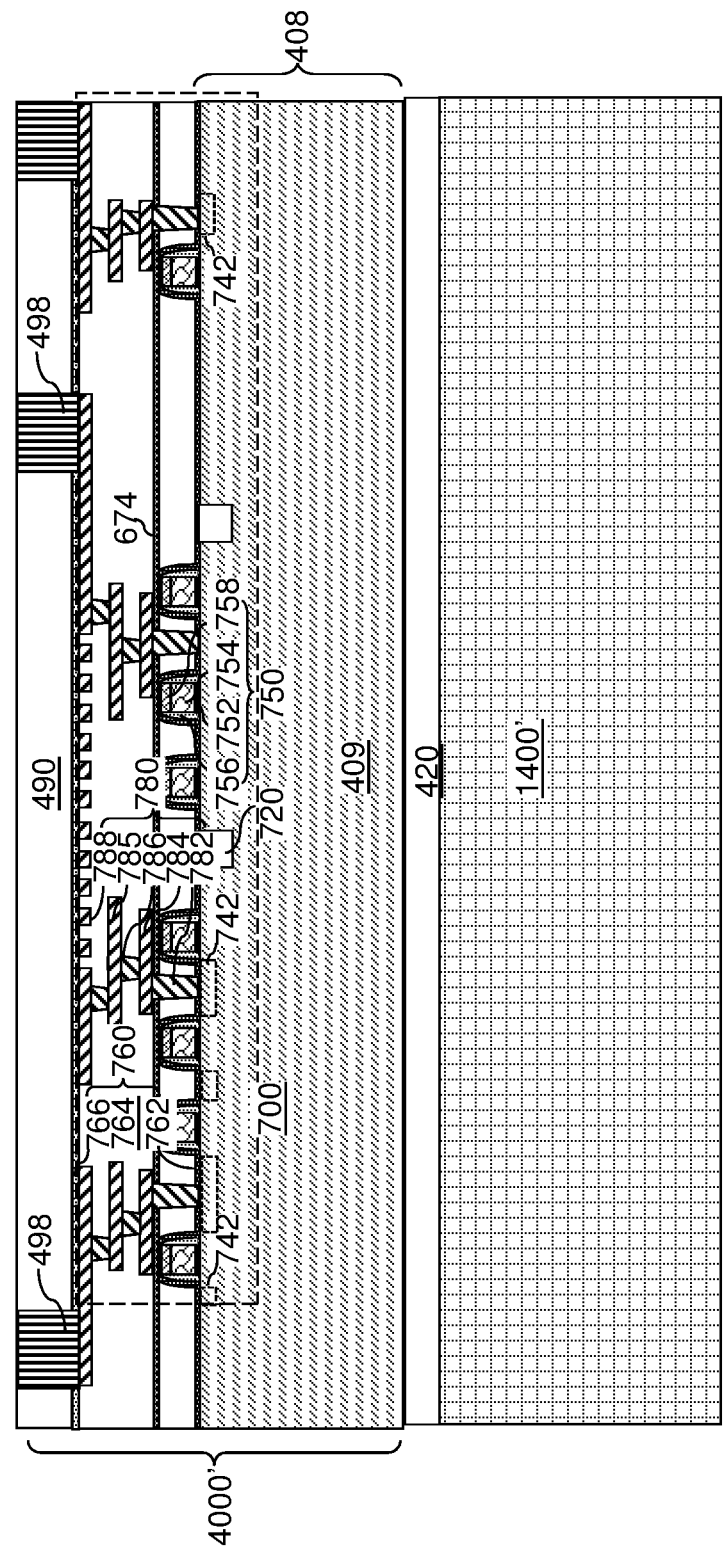

Referring to FIG. 16A, an optional derivative of the second exemplary structure is illustrated, which can be derived from the second exemplary structure of FIG. 15 by forming a pad level dielectric layer 420 on the backside insulating layer 406. The pad level dielectric layer 420 includes a planarizable dielectric material such as silicon oxide. The pad level dielectric layer 420 can be deposited, for example, by chemical vapor deposition or spin-coating, and can be planarized such that the top surface (in an upside down state) of the pad level dielectric layer 420 is coplanar with the top surface of the second integrated through-substrate via and pad structures (418, 416). FIG. 16B illustrates a second semiconductor chip 4000' of an alternative embodiment, which differs from the second semiconductor chip 4000 shown in FIGS. 13 to 16A in that the second semiconductor chip 4000' of this alternative embodiment lacks the second integrated through-substrate via and pad structure (418, 416). In other words, the second semiconductor chip 4000' containing the CMOS peripheral circuits (i.e., second semiconductor devices 700) lacks the second through-substrate via structures 416. The second semiconductor chip 4000' can be used as the bottom most or top most chip in the bonded chip assembly structure.

A second back-side handle substrate 1400' can be attached to the physically exposed surface of the pad level dielectric layer 420 and/or to the physically exposed surfaces of the second integrated through-substrate via and pad structures (418, 416) employing an adhesive material layer or by any other suitable bonding methods. The second front side handle substrate 1400 can be detached from the front side surface of the second semiconductor chip (4000, 4000'). A suitable surface clean process can be performed to remove residual adhesive materials from the top surface of the bonding pad level dielectric layer 490. In this case, the front side bonding pad structures 498 can be physically exposed on the front side of the second semiconductor chip (4000, 4000').

Generally, a second semiconductor chip (4000, 4000') comprising a second semiconductor substrate 408 is provided. The second semiconductor devices 700 are located over a front side surface of the second semiconductor substrate 408, and second bonding pad structures (418 or 498) are electrically connected to a respective one of the second semiconductor devices 700.

Figure 17A:
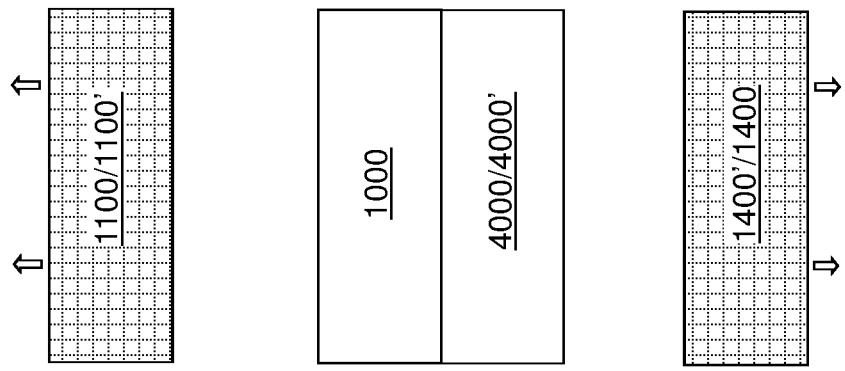
FIGS. 17A-17C illustrate sequential vertical cross-sectional views during formation of a first exemplary chip assembly structure according to an embodiment of the present disclosure.
Figure 17B:
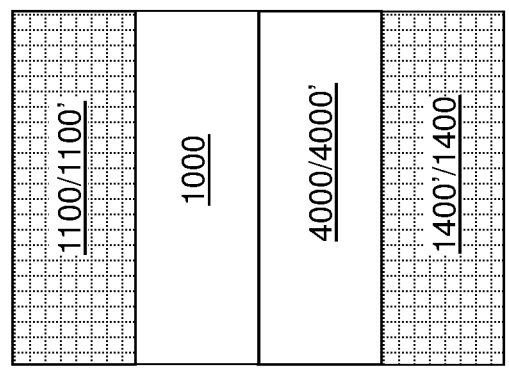
Figure 17C:
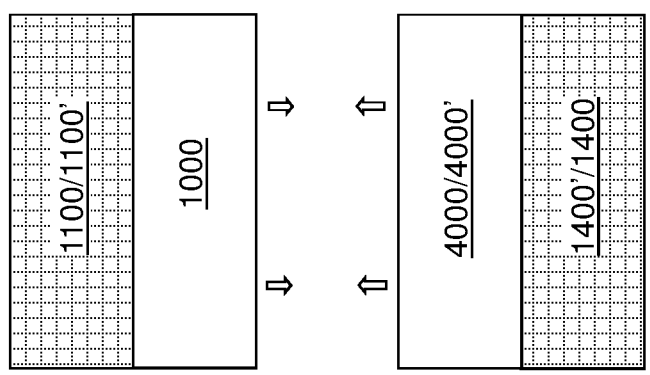

FIGS. 17A-17C illustrate sequential vertical cross-sectional views during formation of a first exemplary chip assembly structure according to an embodiment of the present disclosure. Referring to FIG. 17A, a first semiconductor chip 1000 attached to a first handle substrate (1100 or 1100') and a second semiconductor chip (4000, 4000') attached to a second handle substrate (1400' or 1400) are provided. In case a first front side handle substrate 1100 is employed, backside bonding pad structures 318 are physically exposed on the back side of the first semiconductor chip 1000 that faces the second semiconductor chip (4000, 4000'). In case a first back-side handle substrate 1100' is employed, front side bonding pad structures 298 are physically exposed on the front side of the first semiconductor chip 1000 that faces the second semiconductor chip (4000, 4000'). In case a second back-side handle substrate 1400' is employed, front side bonding pad structures 498 are physically exposed on the front side of the second semiconductor chip 4000 that faces the first semiconductor chip 1000. In case a second front side handle substrate 1400 is employed, backside bonding pad structures 418 are physically exposed on the back side of the first semiconductor chip 1000 that faces the second semiconductor chip 4000. The first semiconductor chip 1000 can include first bonding pad structures (298, 318), and the second semiconductor chip (4000, 4000') can include second bonding pad structures (498, 418). If both first and second bonding pad structures are present, then the pattern of the first bonding pad structures (298, 318) can be a mirror image of the pattern of the second bonding pad structures (498, 418).

Referring to FIG. 17B, the first semiconductor chip 1000 and the second semiconductor chip (4000, 4000') can be bonded by aligning the first bonding pad structures (318 or 298) with a respective one of the second bonding pad structures (498 or 418), and by inducing surface activated bonding between the first and second bonding pad structures. For example, the first bonding pad structures (318 or 298) and the second bonding pad structures (498 or 418) can comprise, or consist essentially of, copper, and the surface activated bonding can be induced by annealing the first exemplary chip assembly structure while the first bonding pad structures (318 or 298) and the second bonding pad structures (498 or 418) are in physical contact.

Referring to FIG. 17C, the first handle substrate (1100 or 1100') can be detached from the first semiconductor chip 1000, and the second handle substrate (1400' or 1400) can be detached from the second semiconductor chip (4000, 4000'). Various methods for deactivating the adhesive force between the handle substrates and the semiconductor chips can be employed. Methods for deactivating the adhesive force include, but are not limited to, ultraviolet radiation, chemical etching, thermal treatment or mechanical separation. Suitable surface cleaning processes can be performed to clean the first semiconductor chip 1000 and the second semiconductor chip (4000, 4000') as needed. In one embodiment, the second semiconductor devices in the second semiconductor chip (4000, 4000') can comprise peripheral (e.g., driver circuit) devices that provide control signals for operation of the two-dimensional array of memory stack structures in the first semiconductor chip 1000.

Figure 18A:
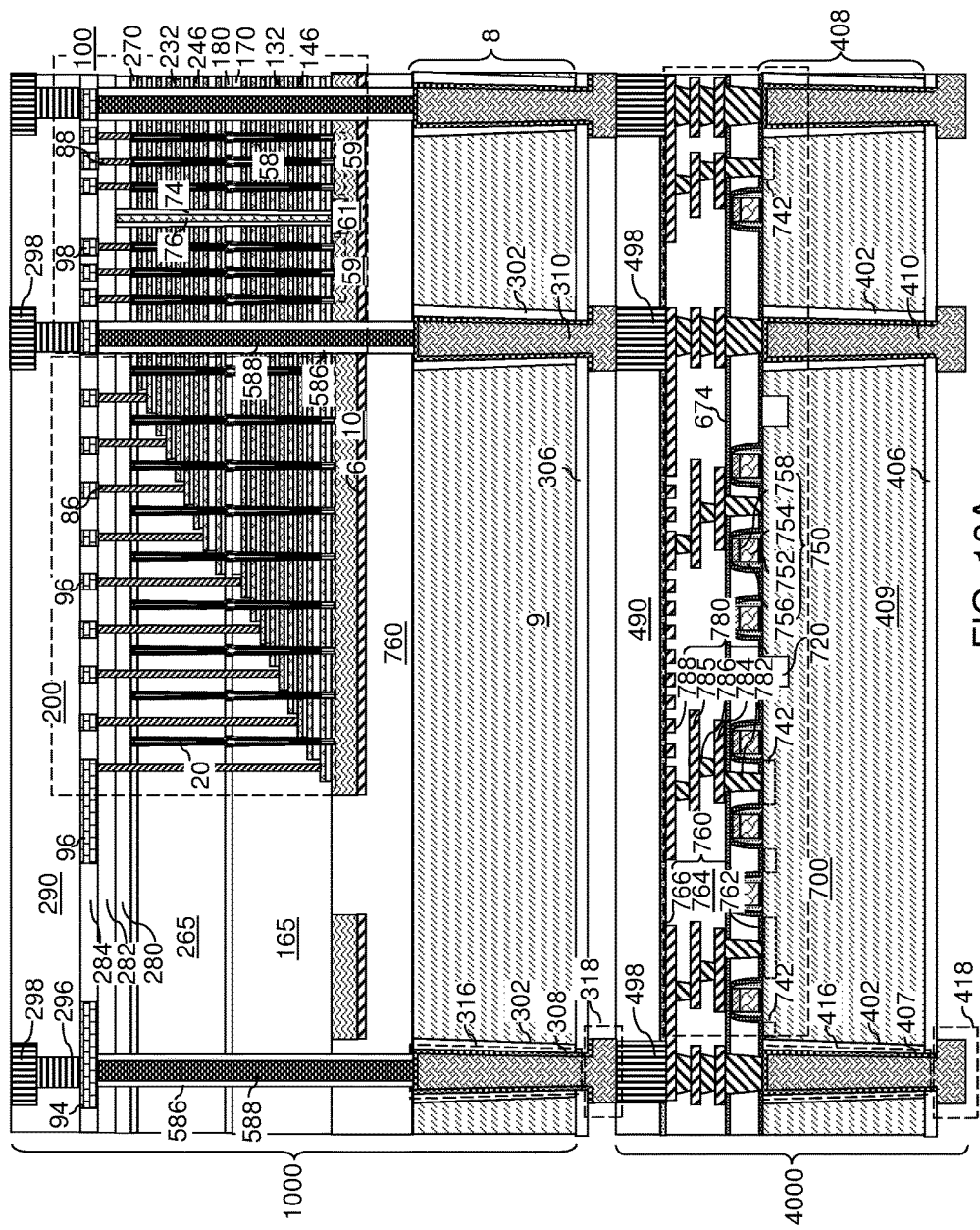
FIGS. 18A and 18B are magnified views of the respective first and first alternative exemplary chip assembly structures after bonding the first semiconductor chip with the second semiconductor chip according to embodiments of the present disclosure.

Referring to FIG. 18A, an embodiment of the first exemplary chip assembly structure is illustrated after bonding the first semiconductor chip 1000 with the second semiconductor chip 4000. In this embodiment, the backside bonding pad structures 318 of the first semiconductor chip 1000 are bonded to the front side bonding pad structures 498 of the first semiconductor chip 4000 through copper-to-copper bonding.

Figure 18B:
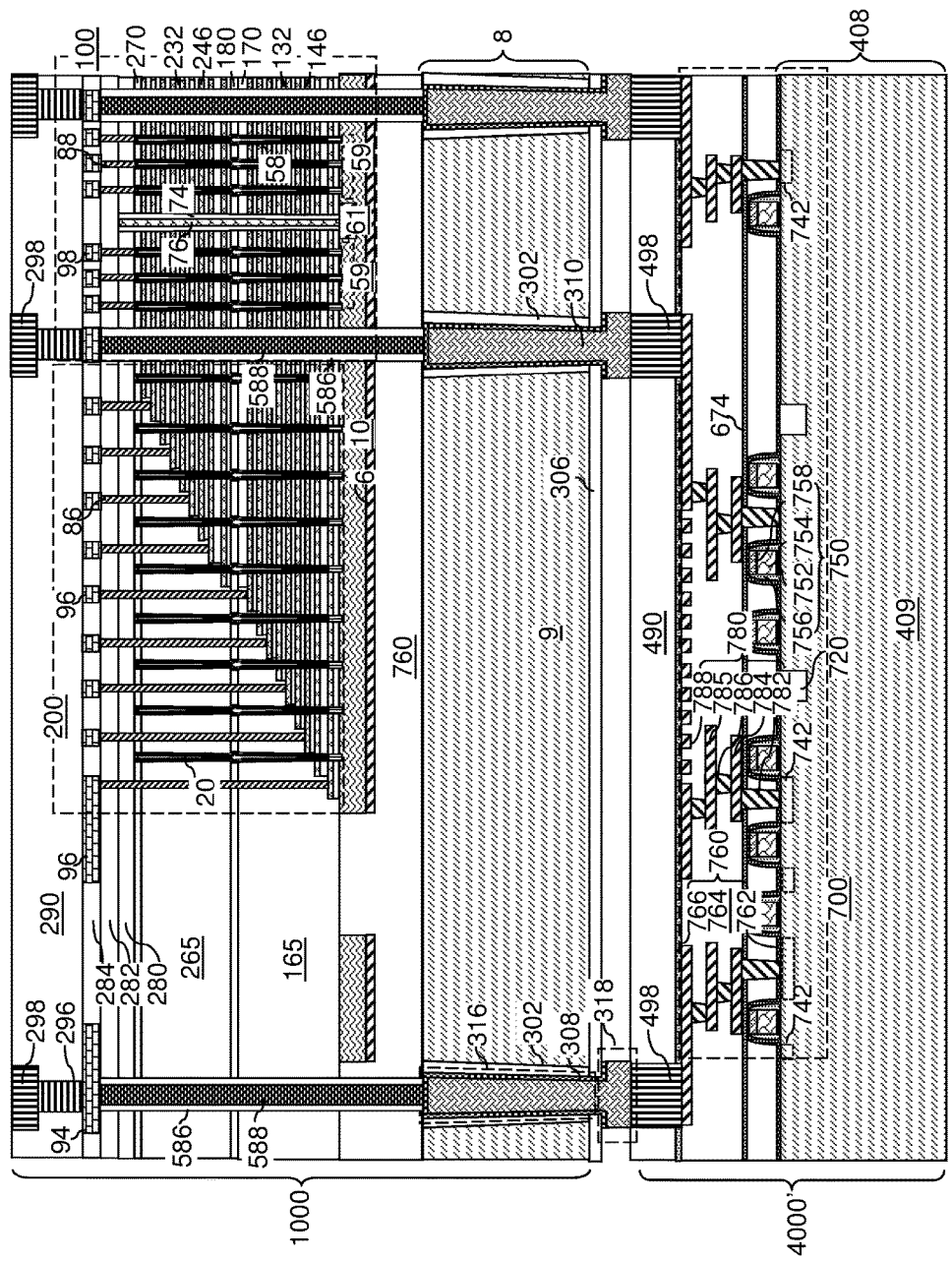

FIG. 18B illustrates an alternative embodiment of the first alternative exemplary chip assembly structure after bonding the first semiconductor chip 1000 with the second semiconductor chip 4000' shown in FIG. 16B. If the second semiconductor chip 4000' of the alternative embodiment is used, then the second back-side handle substrate 1400' can be omitted.

FIGS. 19A-19L illustrate sequential vertical cross-sectional views during formation of a second exemplary chip assembly structure according to an embodiment of the present disclosure.

Figure 19C:
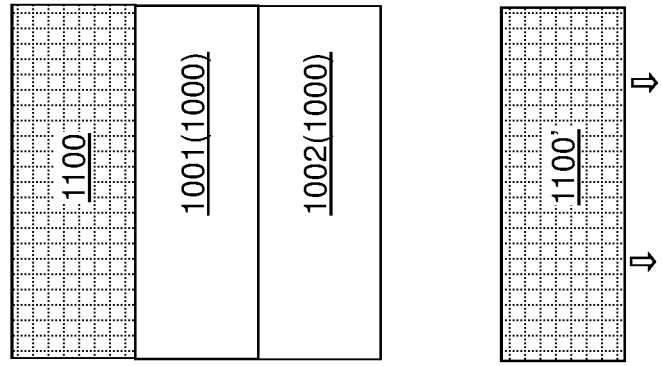
FIGS. 19A-19L illustrate sequential vertical cross-sectional views during formation of a second exemplary chip assembly structure according to an embodiment of the present disclosure.
Figure 19B:
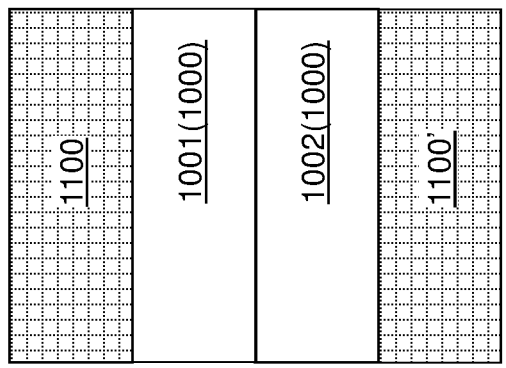
Figure 19A:
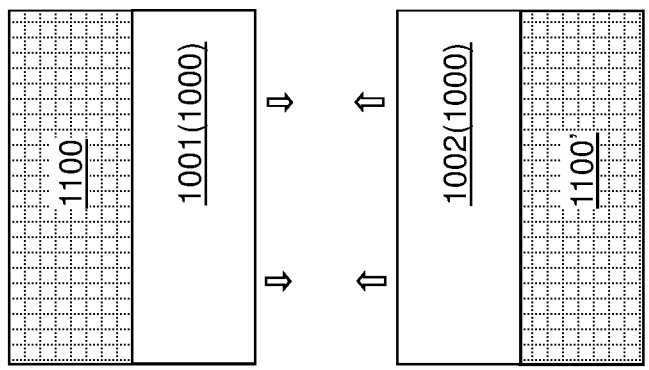

Referring to FIG. 19A, two instances of the first semiconductor chip 1000 illustrated in FIG. 11 or FIG. 12 can be provided, which are herein referred to as a first semiconductor chip 1001 and a second semiconductor chip 1002, respectively, hereafter. The first semiconductor chip 1001 can be provided on a backside (i.e., bottom side) of a front side handle substrate 1100, and the second semiconductor chip 1002 can be provided on a front side (i.e., top side) of a backside handle substrate 1100'. The first semiconductor chip 1001 can include backside bonding pad structures 318 as first bonding pad structures, and the second semiconductor chip 1002 can include front side bonding pad structures 298 as second bonding pad structures. The pattern of the first bonding pad structures 318 can be a mirror image of the pattern of the second bonding pad structures 298.

Referring to FIG. 19B, the first semiconductor chip 1001 and the second semiconductor chip 1002 can be bonded by aligning the first bonding pad structures 318 with a respective one of the second bonding pad structures 298, and by inducing surface activated bonding between the first and second bonding pad structures. For example, the first bonding pad structures 318 and the second bonding pad structures 298 can comprise, or consist essentially of, copper, and the surface activated bonding can be induced by annealing the first exemplary chip assembly structure while the first bonding pad structures 318 and the second bonding pad structures 298 are in physical contact.

Referring to FIG. 19C, one of the front side handle substrate 1100 and the backside handle substrate 1100' can be detached. For example, the backside handle substrate 1100' can be detached from the second semiconductor chip 1002. Various methods for deactivating the adhesive force between the backside handle substrate 1100' and the second semiconductor chip 1002 can be employed. Suitable surface cleaning processes can be performed to clean the bottom surface of the second semiconductor chip 1002 as needed.

Figure 19F:
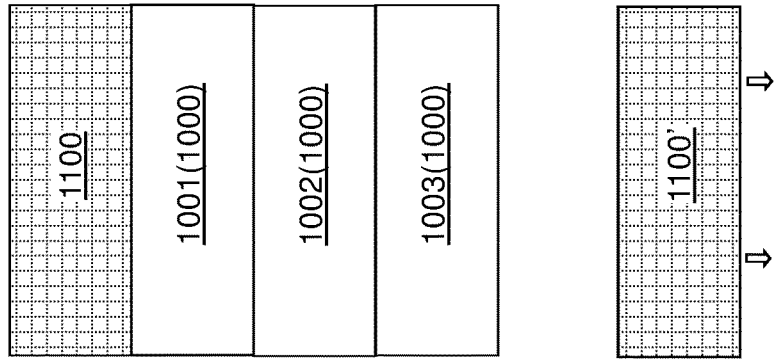
Figure 19E:
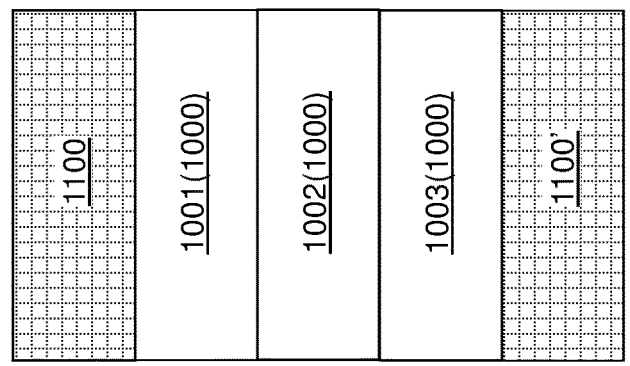
Figure 19D:
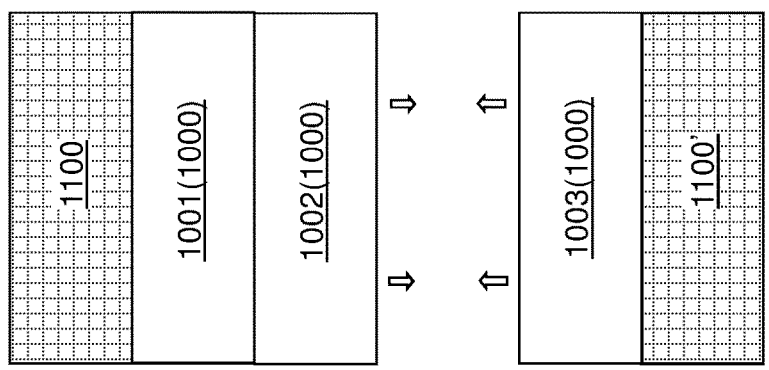

Referring to FIG. 19D, a third instance of the first semiconductor chip 1000 described in FIG. 11 or FIG. 12 is provided on a front side (i.e., top side) of a backside handle substrate 1100', which is here in referred to as a third semiconductor chip 1003. The third semiconductor chip 1003 comprises a third semiconductor substrate (which can be structurally and compositionally the same as the first semiconductor substrate 8), third semiconductor devices 600 (which may be three-dimensional memory devices) located over a front side surface of the third semiconductor substrate, and third-chip bonding pad structures (which can be structurally and compositionally the same as the front side bonding pad structures 298) located on a front side of the third semiconductor chip 1003 and electrically connected to a respective one of the third semiconductor devices. The bonded stack of the first semiconductor chip 1001 and the second semiconductor chip 1002 can include backside bonding pad structures 318 as first bonding pad structures, and the third semiconductor chip 1003 can include front side bonding pad structures 298 as second bonding pad structures. The pattern of the first bonding pad structures 318 can be a mirror image of the pattern of the second bonding pad structures 298.

Referring to FIG. 19E, the second semiconductor chip 1002 and the third semiconductor chip 1003 can be bonded by aligning the first bonding pad structures 318 of the second semiconductor chip 1002 with a respective one of the second bonding pad structures 298 of the third semiconductor chip 1003, and by inducing surface activated bonding between the first and second bonding pad structures.

Referring to FIG. 19F, one of the front side handle substrate 1100 and the backside handle substrate 1100' can be detached. For example, the backside handle substrate 1100' can be detached from the third semiconductor chip 1003. Various methods for deactivating the adhesive force between the backside handle substrate 1100' and the third semiconductor chip 1003 can be employed. Suitable surface cleaning processes can be performed to clean the bottom surface of the third semiconductor chip 1003 as needed.

Figure 19I:
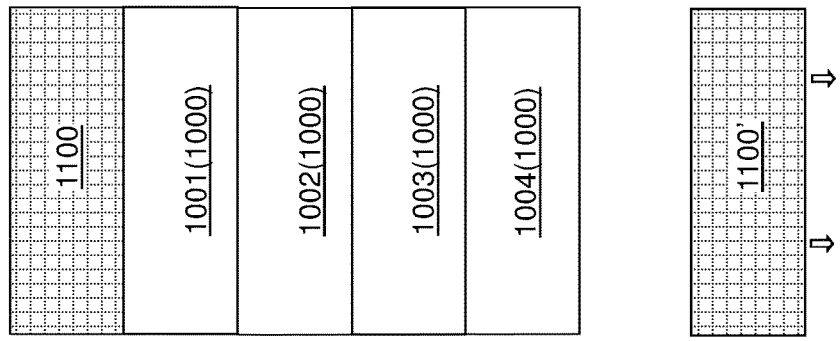
Figure 19H:
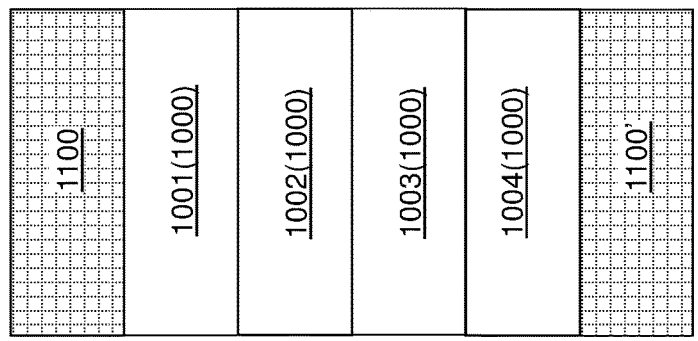
Figure 19G:
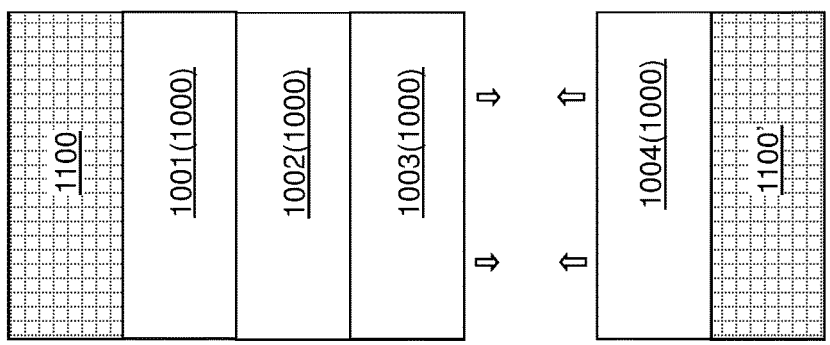

Referring to FIG. 19G, a fourth instance of the first semiconductor chip 1000 described in FIG. 11 or FIG. 12 is provided on a front side (i.e., top side) of a backside handle substrate 1100', which is here in referred to as a fourth semiconductor chip 1004.

Referring to FIG. 19H, the processing steps of FIG. 19E can be performed mutatis mutandis to bond the fourth semiconductor chip 1004 to the chip assembly structure including the first, second, and third semiconductor chips (1001, 1002, 1003).

Referring to FIG. 19I, the processing steps of FIG. 19F can be performed mutatis mutandis to detach the backside handle substrate 1100'.

Figure 19L:
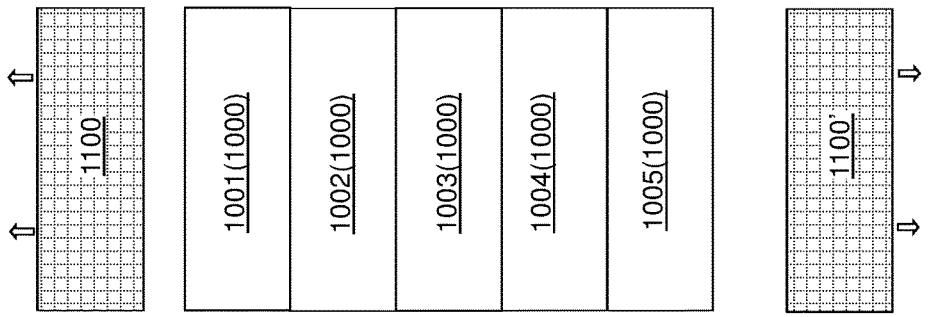
Figure 19K:
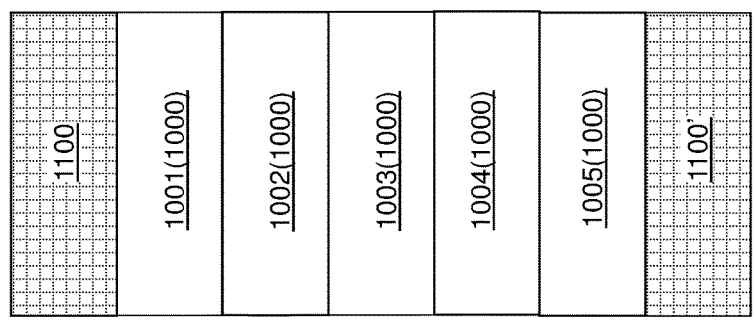
Figure 19J:
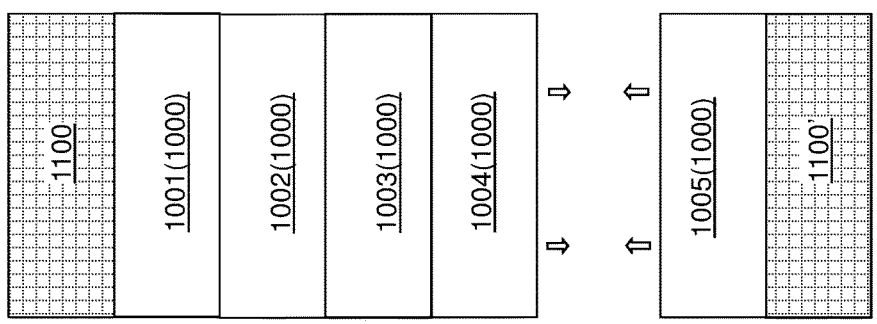

Referring to FIG. 19J, a fifth instance of the first semiconductor chip 1000 described in FIG. 11 or FIG. 12 is provided on a front side (i.e., top side) of a backside handle substrate 1100', which is here in referred to as a fifth semiconductor chip 1005.

Referring to FIG. 19K, the processing steps of FIG. 19E can be performed mutatis mutandis to bond the fifth semiconductor chip 1005 to the chip assembly structure including the first, second, third, and fourth semiconductor chips (1001, 1002, 1003, 1004).

Referring to FIG. 19L, the processing steps of FIG. 19F can be performed mutatis mutandis to detach the backside handle substrate 1100'.

The set of processing steps of FIGS. 19D-19F can be repeated mutatis mutandis as many times as needed to provide a chip assembly structure that includes N bonded semiconductor chips 1000, in which N is an integer greater than 1, such as 2, 3, 4, 5, 6, 7, 8, 9, 10, 11, 12, or a greater integer.

In one embodiment, the first semiconductor devices in the first semiconductor chip 1000 can include a three-dimensional memory device including an alternating stack of insulating layers (132, 232) and electrically conductive layers (146, 246) and a two-dimensional array of memory stack structures 58 including a respective vertical stack of memory elements located at levels of the electrically conductive layers (146, 246), and the second semiconductor devices in the second semiconductor chip 1000 can comprise an additional three-dimensional memory device including an additional alternating stack of additional insulating layers (132, 232) and additional electrically conductive layers (146, 246) and an additional two-dimensional array of memory stack structures 58 including a respective vertical stack of memory elements located at levels of the additional electrically conductive layers. At least one additional semiconductor chip 1000 that is identical to the first and/or second semiconductor chips 1000 can be bonded to the bottom or to the top of the stack of the first and second semiconductor chips 1000. After stacking (N–1) semiconductor chips 1000, in which N is an integer greater than 2, an N-th semiconductor chip that is the same as the second semiconductor chip 4000 illustrated in FIG. 15, 16A or 16B can be bonded to the stack of the (N–1) semiconductor chips 1000. The N-th semiconductor chip includes N-th semiconductor devices. In this case, the N-th semiconductor devices in the N-th semiconductor chip can comprise peripheral devices that provide control signals for operation of the two-dimensional array of memory stack structures in the first through (N–1)-th semiconductor chip.

Figure 20C:
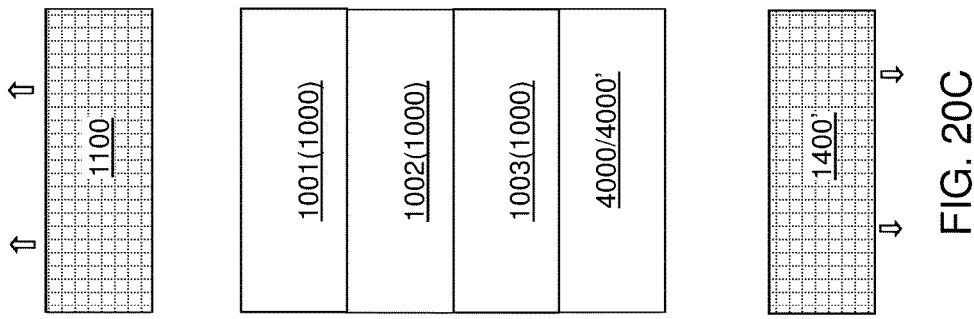
FIGS. 20A-20C illustrate sequential vertical cross-sectional views during formation of a third exemplary chip assembly structure according to an embodiment of the present disclosure.
Figure 20B:
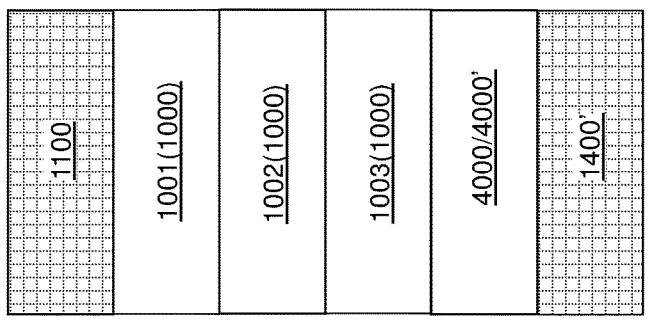
Figure 20A:
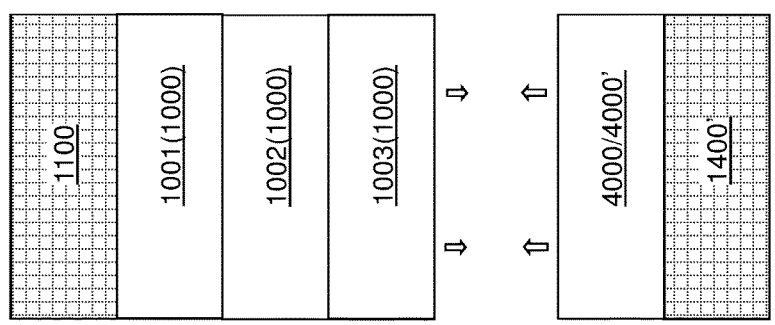

Referring to FIGS. 20A-20C, a third chip assembly structure is illustrated during a fabrication process. In this case, the integer N is 4. The third chip assembly structure of FIG. 20 can be derived from the chip assembly structure of FIG. 19F. A second semiconductor chip 4000 illustrated in FIG. 16A or 16B can be employed as an N-th semiconductor chip 4000 (such as a fourth semiconductor chip) at the processing steps of FIG. 20A. For example, the (N–1)-th semiconductor chip 1003 (which is the third semiconductor chip for the case of N=4) includes backside bonding pad structures 318 as first bonding pad structures, and the N-th semiconductor chip 4000 includes front side bonding pad structures 498 as second bonding pad structures. The pattern of the first bonding pad structures 318 can be a mirror image of the pattern of the second bonding pad structures 498.

Referring to FIG. 20B, the (N–1)-th semiconductor chip 1003 and the N-th semiconductor chip 4000 can be bonded by aligning the first bonding pad structures 318 with a respective one of the second bonding pad structures 498, and by inducing surface activated bonding between the first and second bonding pad structures. For example, the first bonding pad structures 318 and the second bonding pad structures 498 can comprise, or consist essentially of, copper, and the surface activated bonding can be induced by annealing the first exemplary chip assembly structure while the first bonding pad structures 318 and the second bonding pad structures 498 are in physical contact.

Referring to FIG. 20C, the front side handle substrate 1100 and the backside handle substrate 1100' can be detached. Various methods for deactivating the adhesive force between the backside handle substrate 1100' and the N-th semiconductor chip 4000, and for deactivating the adhesive force between the front side handle substrate 1100 and the (N–1)-th semiconductor chip 1103 can be employed. Suitable surface cleaning processes can be performed subsequently.

Figure 21:
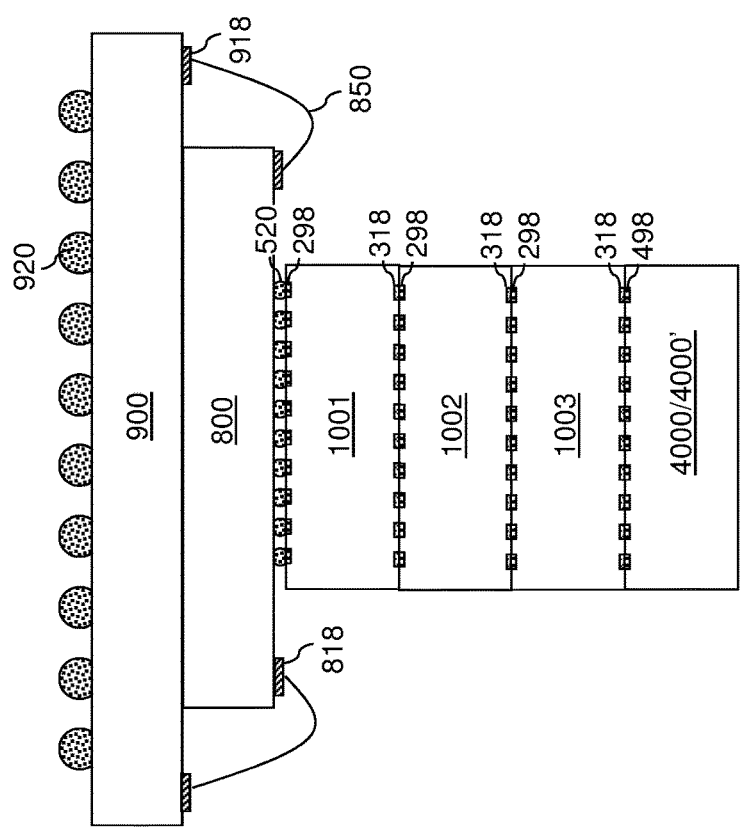
FIG. 21 is a vertical cross-sectional view of a fourth chip assembly structure after electrically connecting a plurality of semiconductor chips after connecting an interposer and a packaging substrate according to an embodiment of the present disclosure.

Referring to FIG. 21, a fourth chip assembly structure is illustrated, which can be derived from the third chip assembly structure by attaching a topmost semiconductor chip 1001 or a bottommost semiconductor chip 4000 to an interposer 800. For example, copper bonding pads 520 can be provided on one side of the interposer with a mirror image of the pattern of the bonding pad structures (such as the front side bonding pads 298 of the topmost semiconductor chip 1001). Copper-to-copper bonding can be employed to form a chip assembly structure in which multiple instances of the first semiconductor chip 1000 as provided at the processing steps of FIG. 11 or FIG. 12, and an instance of the second semiconductor chip (4000, 4000')

as provided at the processing steps of FIG. 15, 16A or 16B are bonded to the interposer 800.

Subsequently, a packaging substrate 900 can be provided, on which the interposer 800 can be mounted. In one embodiment, electrical connections between the packaging substrate 900 and the interposer 800 can be provided by wire bonding. Interposer-side wire bonding pads 818 can be provided on the interposer 800, and packaging-substrate-side wire bonding pads 918 can be provided on the packaging substrate 900. Interconnection wires 850 can be employed to provide electrical connection between pairs of an interposer-side wire bonding pad 818 and a packaging-substrate-side wire bonding pad 918. An array of solder balls 920 may be employed to attach the packaging substrate 900 to another electronic component such as a circuit board.

Figure 22A:
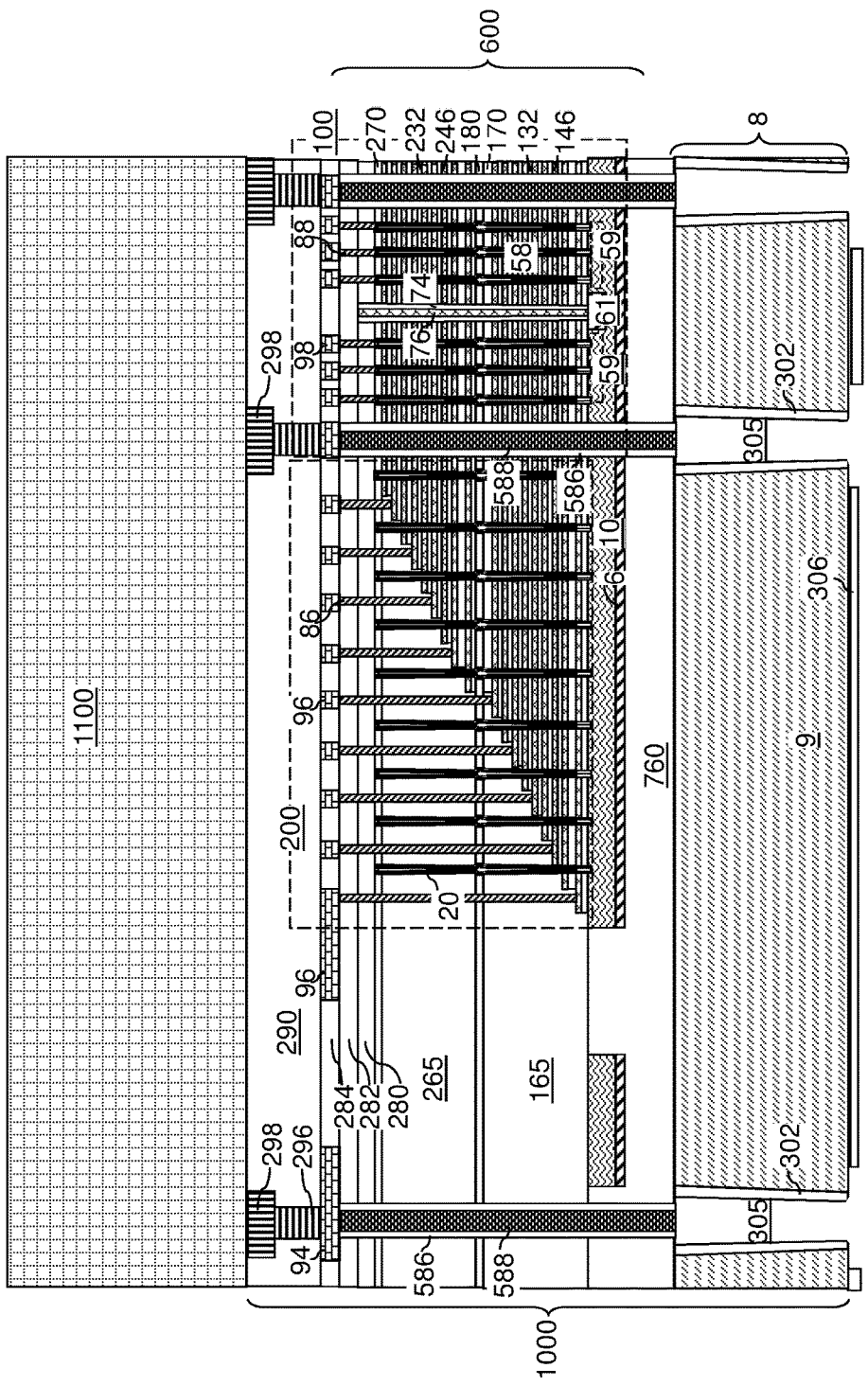
FIGS. 22A-22C illustrate sequential vertical cross-sectional views during formation of an alternative first integrated through-substrate via and pad structures according to an alternative embodiment of the present disclosure.
Figure 22B:
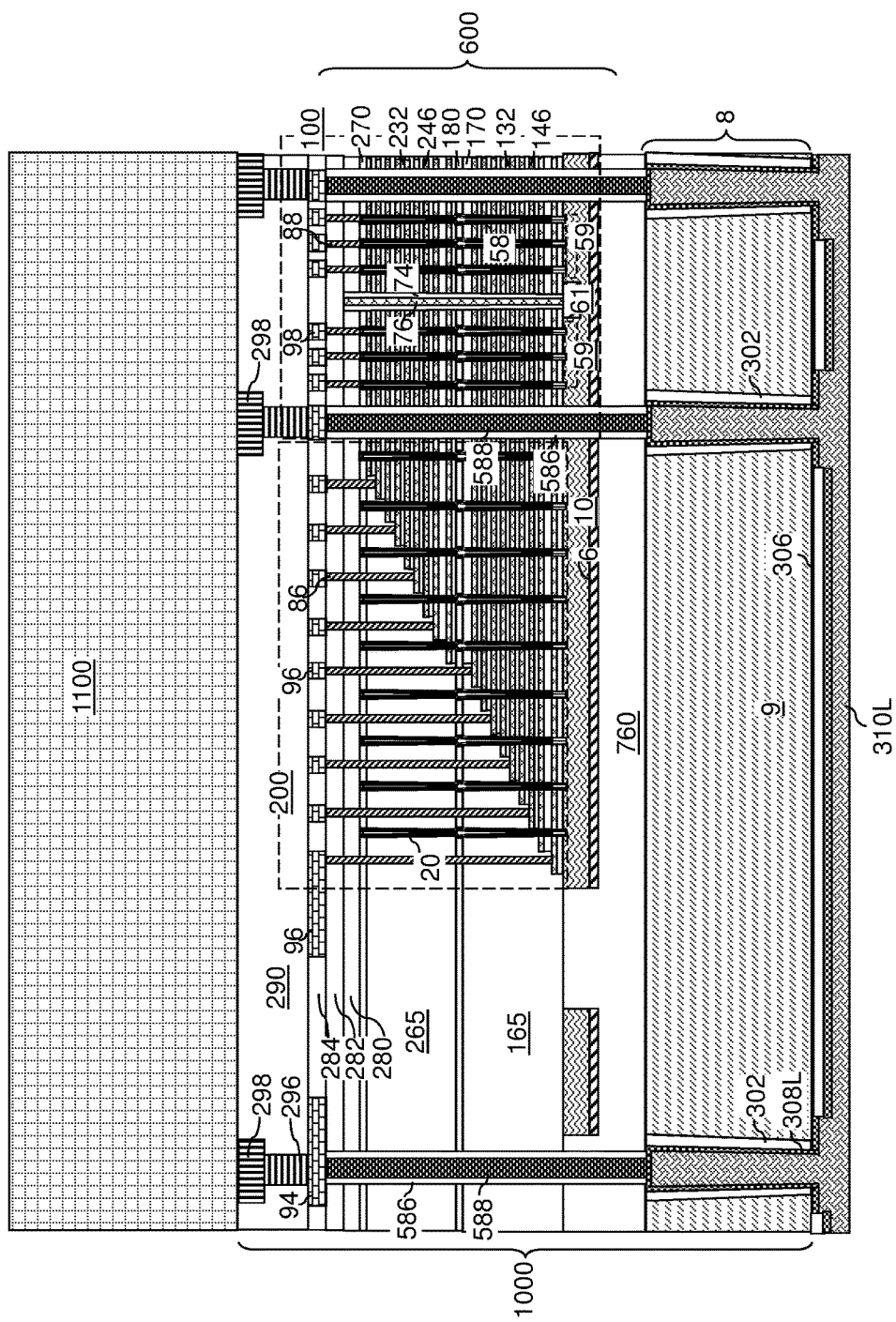
Figure 22C:
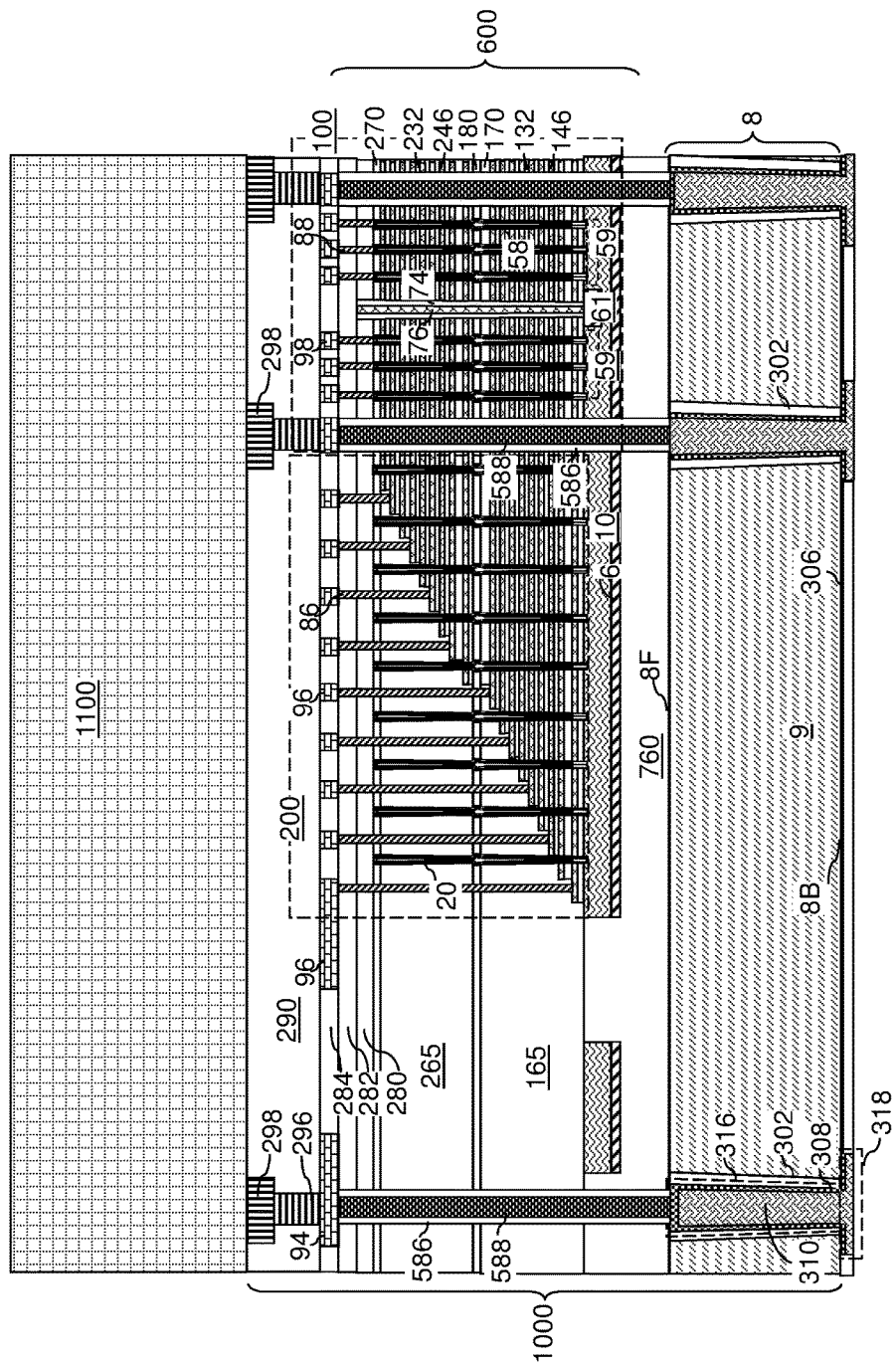

FIGS. 22A-22C illustrate sequential vertical cross-sectional views during formation of an alternative first integrated through-substrate via and pad structures according to an alternative embodiment of the present disclosure. The alternative structure shown in FIG. 22A can be derived from the structure shown in FIG. 9 by recessing the backside insulating layer 306 away from the through-substrate cavities 305. For example, a photoresist layer (not shown) can be deposited over the backside insulating layer 306 and into the through-substrate cavities 305. The photoresist layer is then patterned to expose regions of the backside insulating layer 306 that surround the through-substrate cavities 305. The exposed regions of the backside insulating layer 306 are removed by etching, followed by removing the photoresist layer by ashing to form the alternative structure shown in FIG. 22A.

Referring to FIG. 22B, the metallic liner 308L and a metal fill material layer 310L can be sequentially deposited in the through-substrate cavities 305 and over the remaining portions of the backside insulating layer 306, used the process described above with respect to FIG. 10.

Referring to FIG. 22C, the metallic liner 308L and the metal fill material layer 310L can be recessed by chemical mechanical planarization using the remaining portions of the backside insulating layer 306 as a polish step. The polishing step results in the first integrated through-substrate via and pad structures (316, 318) being embedded in the backside insulating layer 306, and having an exposed back side surface that is co-planar with the back side surface of the backside insulating layer 306. The process then proceeds as described above with respect to any of the FIGS. 17A to 21.

Referring to all drawings and according to various embodiments of the present disclosure, a chip assembly structure is provided, which comprises: a first semiconductor chip (1000, 1003) comprising a first semiconductor substrate 8, first semiconductor devices located over a front side surface of the first semiconductor substrate 8, and first integrated through-substrate via and pad structures (318, 316) including a respective first through-substrate via structure 316 and a respective first bonding pad structure 318 and comprising a first metallic material, wherein the first integrated through-substrate via and pad structures (318, 316) vertically extend from the front side surface of the first semiconductor substrate 8 to a backside surface of the first semiconductor substrate 8 and are electrically isolated from the first semiconductor substrate 8 by a respective tubular insulating spacer 302 and by a backside insulating layer 306 contacting the backside surface of the first semiconductor substrate 8, wherein each of the first integrated through-substrate via and pad structures (318, 316) has a greater lateral dimension within a horizontal plane including the front side surface of the first semiconductor substrate 8 than within a horizontal plane including the backside surface of the first semiconductor substrate 8, wherein each of the first integrated through-substrate via and pad structures (318, 316) comprises a respective metallic liner 308 and a respective metallic fill material portion 310, the respective metallic liner 308 including a planar portion having a planar surface within the horizontal plane located at the front side surface 8F of the first semiconductor substrate 8 and a tubular portion contacting an inner sidewall of a respective one of the tubular insulating spacers 302, wherein the planar surface is free of any opening therethrough and is laterally bounded by an upper periphery of a respective first integrated through-substrate via and pad structure (318, 316), and wherein the respective metallic liner 308 separates a via portion of the respective metallic fill material portion 310 laterally from the respective one of the tubular insulating spacers 302 and vertically from the horizontal plane located at the front side surface 8F of the first semiconductor substrate 8; and a second semiconductor chip 4000 comprising a second semiconductor substrate 408, second semiconductor devices 710 located over a front side surface of the second semiconductor substrate 408, and second bonding pad structures {(418, 416), 498} electrically connected to a respective one of the second semiconductor devices 710, wherein the first bonding pad structures 318 are directly bonded to a respective one of the second bonding pad structures {(418, 416), 498} by surface activated bonding, which can be a metal-to-metal bonding, such as copper-to-copper bonding.

In one embodiment, each first through-substrate via structure 316 of the first integrated through-substrate via and pad structures (318, 316) has a tapered straight sidewall that continuously extends between the front side surface of the first semiconductor substrate 8 to the backside surface of the first semiconductor substrate 8.

In one embodiment, the tubular insulating spacers 302 comprise thermal silicon oxide that is substantially free of carbon and hydrogen, and the backside insulating layer 306 comprises chemical vapor deposition silicon oxide that includes carbon and hydrogen at atomic concentrations greater than 1 part per million.

In one embodiment, each of the first integrated through-substrate via and pad structures (318, 316) includes: a metallic liner 308 contacting an inner sidewall of a respective tubular insulating spacer 302; and a metallic fill material portion 310 comprising copper and including a via metal portion embedded in the metallic liner 308 and a pad metal portion having a greater lateral extent than the via metal portion.

In one embodiment, the first semiconductor devices comprise a including an alternating stack of insulating layers (132, 232) and electrically conductive layers (146, 246) and a two-dimensional array of memory stack structures 58 including a respective vertical stack of memory elements located at levels of the electrically conductive layers (146, 246), and the second semiconductor devices 710 in the second semiconductor chip 4000 comprise peripheral devices that provide control signals for operation of three-dimensional memory device of the first semiconductor chip (1000, 1003).

In some embodiments, the chip assembly structure can further comprise a third semiconductor chip 1002 comprising a third semiconductor substrate 8, third semiconductor devices located over a front side surface of the third semiconductor substrate 8, and third-chip bonding pad structures 318 electrically connected to a respective one of the third semiconductor devices, wherein the first semiconductor chip 1002 further comprises front side bonding pad structures 298 electrically connected to the first integrated through-substrate via and pad structures (318, 316) and bonded to a respective one of the third-chip bonding pad structures 318 by surface activated bonding. As noted above, ordinals merely identify multiple instances of similar elements, and different ordinals may be employed across the specification and the claims of the instant disclosure.

In one embodiment, the third semiconductor devices 1002 comprise an additional three-dimensional memory device including an additional alternating stack of additional insulating layers (132, 232) and additional electrically conductive layers (146, 246) and an additional two-dimensional array of memory stack structures 58 including a respective vertical stack of memory elements located at levels of the additional electrically conductive layers (146, 246); and the second semiconductor devices 710 in the second semiconductor chip 4000 comprise additional peripheral devices that provide control signals for operation of the additional three-dimensional memory device of the third semiconductor chip 1002.

In some embodiments, the first semiconductor chip (1000, 1003) further comprises sets of metal interconnect structures (588, 94, 296) located between the first semiconductor substrate 8 and the front side bonding pad structures 298, wherein each set of metal interconnect structures (588, 94, 296) provide an electrically conductive path between a respective pair of a front side bonding pad structures 298 and a first integrated through-substrate via and pad structure (318, 316), and at least one set of metal interconnect structures (588, 94, 296) extends through the alternating stack of insulating layers (132, 232) and electrically conductive layers (146, 246).

In some embodiment, a chip assembly structure is provided, which comprises: a first semiconductor chip 1003 comprising a first semiconductor substrate 8, first semiconductor devices located over a front side surface of the first semiconductor substrate 8, first through-substrate via structures 316 vertically extending from the front side surface of the first semiconductor substrate 8 to a backside surface of the first semiconductor substrate 8 and are electrically isolated from the first semiconductor substrate 8 by a respective tubular insulating spacer 302 and by a backside insulating layer 306 contacting the backside surface of the first semiconductor substrate 8, and first bonding pad structures 318 located on the first through-substrate via structures 316 at a backside of the first semiconductor substrate 8, wherein the first semiconductor devices comprise a three-dimensional memory device including an alternating stack of insulating layers (132, 232) and electrically conductive layers (146, 246) and a two-dimensional array of memory stack structures 58 including a respective vertical stack of memory elements located at levels of the electrically conductive layers (146, 246); a second semiconductor chip 4000 comprising a second semiconductor substrate 408, second semiconductor devices 710 located over a front side surface of the second semiconductor substrate 408, and second bonding pad structures (418 or 498) electrically connected to a respective one of the second semiconductor devices 710, wherein the first bonding pad structures 318 are directly bonded to a respective one of the second bonding pad structures (418 or 498), such as by surface activated bonding, wherein the second semiconductor devices 710 in the second semiconductor chip 4000 comprise peripheral devices that provide control signals for operation of the two-dimensional array of memory stack structures 58 in the first semiconductor chip 1003; and a third semiconductor chip 1002 comprising a third semiconductor substrate 8, third semiconductor devices located over a front side surface of the third semiconductor substrate 8, and third-chip bonding pad structures (318 or 298) electrically connected to a respective one of the third semiconductor devices, wherein the first semiconductor chip 1003 further comprises front side bonding pad structures 298 electrically connected to the first bonding pad structures 318 and directly bonded to a respective one of the third-chip bonding pad structures (318 or 298), such as by surface activated bonding.

In one embodiment, the third semiconductor devices comprise an additional three-dimensional memory device including an additional alternating stack of additional insulating layers (132, 232) and additional electrically conductive layers (146, 246) and an additional two-dimensional array of memory stack structures 58 including a respective vertical stack of memory elements located at levels of the additional electrically conductive layers (146, 246), and the second semiconductor devices 710 of the second semiconductor chip 4000 comprise additional peripheral devices that provide control signals for operation of the additional two-dimensional array of memory stack structures 58 in the third semiconductor chip 1002.

In one embodiment, the first semiconductor chip 1003 further comprises sets of metal interconnect structures (588, 94, 296) located between the first semiconductor substrate 8 and the front side bonding pad structures 298, wherein each set of metal interconnect structures (588, 94, 296) provide an electrically conductive path between a respective pair of a front side bonding pad structure 298 and a first bonding pad structure 318, and at least one set of metal interconnect structures (588, 94, 296) extends through the alternating stack of insulating layers (132, 232) and electrically conductive layers (146, 246).

In one embodiment, the first through-substrate via structures 316 and the first bonding pad structures 318 are portions of first integrated through-substrate via and pad structures (318, 316); each of the first through-substrate via structures 316 has a greater lateral dimension within a horizontal plane including the front side surface of the first semiconductor substrate 8 than within a horizontal plane including the backside surface of the first semiconductor substrate 8; the tubular insulating spacers 302 comprise thermal silicon oxide that is substantially free of carbon and hydrogen; the backside insulating layer 306 comprises chemical vapor deposition silicon oxide that includes carbon and hydrogen at atomic concentrations greater than 1 part per million; and each first through-substrate via structure 316 of the first integrated through-substrate via and pad structures (318, 316) has a tapered straight sidewall that continuously extends between the front side surface of the first semiconductor substrate 8 to the backside surface of the first semiconductor substrate 8.

According to an aspect of the present disclosure, the backside insulating layers (306, 406) are formed prior to formation of semiconductor devices on substrate semiconductor layers (9, 409). Since there is no thermal budget relating to any semiconductor device at this processing step, thermal silicon oxide formed by thermal oxidation or a chemical vapor deposition silicon oxide densified by a high temperature anneal, and thus, having a very low hydrogen content, can be employed for the backside insulating layers (306, 406). Thus, a high quality silicon oxide material having high breakdown electrical field strength can be employed for the backside insulating layers (306, 406) of the devices of the present disclosure.

According to another aspect of the present disclosure, step coverage of the sacrificial material layer 303L is not important, and conformal or non-conformal deposition processes can be employed to deposit the sacrificial material layer. If voids are formed within the volume of the via openings 301, such voids may be employed to accelerate access of the etchant during removal of the sacrificial pillar structures (303, 403). Devices and metal interconnect structures are formed while the sacrificial pillar structures are present, and some metal interconnect structures (588, 782) are formed directly on the sacrificial pillar structures (303, 403).

In case copper is deposited to form the integrated through-substrate via and pad structure {(318, 316), (418, 416)}, copper is not deposited until the first semiconductor substrate is thinned. Thus, substrate thinning-induced copper contamination cab be avoided.

The first semiconductor chips 1000 can be formed without CMOS devices, or only with CMOS devices that are not critically affected by high temperature anneal processes that are employed to form a three-dimensional array of memory cells. The second semiconductor chip 4000 can provide high performance CMOS devices for peripheral circuitry that controls the operation of the three-dimensional memory device of the first semiconductor chips 4000. Metal-to-metal bonding, such as copper-to-copper bonding, can be employed to induce bonding, in which metal atoms (such as copper atoms) diffuse across the interface between opposing, and contacting, pairs of metal bonding pads (such as copper pads). Logic devices provided in a separate semiconductor chip, such as a second semiconductor chip 4000, avoid performance degradation when logic devices are subjected to high temperature anneal processes during manufacturing of the three-dimensional memory devices.

The chip bonding method of the embodiments of the present disclosure provides additional non-limiting advantages. Multiple memory chips, such as multiple instances of the first semiconductor chip 1000 including a respective three-dimensional memory device, can be stacked to share a common logic control chip, such as a second semiconductor chip 4000. Thus, the number of unit processes required to form a single memory chip can be reduced. Since the stacked chips (1000, 4000) are bonded without gaps thereamongst, any increase in resistance and capacitance associated with bonding can be minimized.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A chip assembly structure comprising:
a first semiconductor chip comprising a first semiconductor substrate, first semiconductor devices located over a front side surface of the first semiconductor substrate, and first integrated through-substrate via and pad structures including a respective first through-substrate via structure and a respective first bonding pad structure and comprising a first metallic material, wherein the first integrated through-substrate via and pad structures vertically extend from the front side surface of the first semiconductor substrate to a backside surface of the first semiconductor substrate and are electrically isolated from the first semiconductor substrate by a respective tubular insulating spacer and by a backside insulating layer contacting the backside surface of the first semiconductor substrate, wherein each of the first integrated through-substrate via and pad structures has a greater lateral dimension within a horizontal plane located at the front side surface of the first semiconductor substrate than within a horizontal plane including the backside surface of the first semiconductor substrate, wherein each of the first integrated through-substrate via and pad structures comprises a respective metallic liner and a respective metallic fill material portion, the respective metallic liner including a planar portion having a planar surface within the horizontal plane located at the front side surface of the first semiconductor substrate and a tubular portion contacting an inner sidewall of a respective one of the tubular insulating spacers, wherein the planar surface is free of any opening therethrough and is laterally bounded by an upper periphery of a respective first integrated through-substrate via and pad structure, and wherein the respective metallic liner separates a via portion of the respective metallic fill material portion laterally from the respective one of the tubular insulating spacers and vertically from the horizontal plane located at the front side surface of the first semiconductor substrate; and
a second semiconductor chip comprising a second semiconductor substrate, second semiconductor devices located over a front side surface of the second semiconductor substrate, and second bonding pad structures electrically connected to a respective one of the second semiconductor devices,
wherein the first bonding pad structures are directly bonded to a respective one of the second bonding pad structures.

2. The chip assembly structure of claim 1, wherein each first through-substrate via structure of the first integrated through-substrate via and pad structures has a tapered straight sidewall that continuously extends between the front side surface of the first semiconductor substrate to the backside surface of the first semiconductor substrate.

3. The chip assembly structure of claim 1, wherein:
the tubular insulating spacers comprise thermal silicon oxide that is substantially free of carbon and hydrogen; and
the backside insulating layer comprises chemical vapor deposition silicon oxide that includes carbon and hydrogen at atomic concentrations greater than 1 part per million.

4. The chip assembly structure of claim 1, wherein the metallic fill material portion comprises copper and includes a pad metal portion having a greater lateral extent than the via metal portion.

5. The chip assembly structure of claim 1, wherein:
the first semiconductor devices comprise a three-dimensional memory device including an alternating stack of insulating layers and electrically conductive layers and a two-dimensional array of memory stack structures including a respective vertical stack of memory elements located at levels of the electrically conductive layers; and
the second semiconductor devices in the second semiconductor chip comprise peripheral devices that provide control signals for operation of the three-dimensional memory device of the first semiconductor chip.

6. The chip assembly structure of claim 4, wherein:
the first semiconductor devices comprise a three-dimensional memory device including a first two-dimensional array of vertical NAND strings; and
the first semiconductor chip further comprises through-memory-level via structures contacting a metal liner within a respective one of the first integrated through-substrate via and pad structures.

7. The chip assembly structure of claim 6, wherein an entire bottom surface of one of the through-memory-level via structures directly contacts a topmost surface of a metal liner of one of the first integrated through-substrate via and pad structures.

8. The chip assembly structure of claim 5, further comprising a third semiconductor chip comprising a third semiconductor substrate, third semiconductor devices located over a front side surface of the third semiconductor substrate, and third-chip bonding pad structures electrically connected to a respective one of the third semiconductor devices,
wherein:
the first semiconductor chip further comprises front side bonding pad structures electrically connected to the first integrated through-substrate via and pad structures and bonded to a respective one of the third-chip bonding pad structures by surface activated bonding.

9. The chip assembly structure of claim 8, wherein:
the third semiconductor devices comprise an additional three-dimensional memory device including an additional alternating stack of additional insulating layers and additional electrically conductive layers and an additional two-dimensional array of memory stack structures including a respective vertical stack of memory elements located at levels of the additional electrically conductive layers; and
the second semiconductor devices in the second semiconductor chip comprise additional peripheral devices that provide control signals for operation of the additional three-dimensional memory device of the third semiconductor chip.

10. The chip assembly structure of claim 8, wherein the first semiconductor chip further comprises sets of metal interconnect structures located between the first semiconductor substrate and the front side bonding pad structures, wherein each set of metal interconnect structures provides an electrically conductive path between a respective pair of a front side bonding pad structure and a first integrated through-substrate via and pad structure.

11. The chip assembly structure of claim 10, wherein:
at least one set of metal interconnect structures extends through the alternating stack of insulating layers and electrically conductive layers; and
at least another set of metal interconnect structures extends through dielectric material portions that are laterally offset from the alternating stack.

12. The chip assembly structure of claim 10, wherein each set of metal interconnect structures comprises:
a through-memory-level via structure that vertically extends through dielectric material portions located at a same level as the first semiconductor devices within the first semiconductor chip;
at least one interconnection metal pad located at a same level as metal lines located within the first semiconductor chip; and
a bonding pad connection via structure electrically shorted to the at least one interconnection metal pad and contacting a respective one of the front side bonding pad structures.

13. A method of forming a chip assembly structure, comprising:
forming sacrificial pillar structures extending from a front side surface of the first semiconductor substrate toward an in-process backside surface of the first semiconductor substrate;
forming first semiconductor devices over the front surface of the first semiconductor substrate;
thinning the first semiconductor substrate after forming the first semiconductor devices by removing a material of the first semiconductor substrate from above the in-process backside surface until the sacrificial pillar structures are exposed in a backside surface of the first semiconductor substrate;
forming through-substrate cavities that vertically extend from the backside surface of the thinned first semiconductor substrate to the front side surface of the thinned first semiconductor substrate by removing the sacrificial pillar structures;
forming first integrated through-substrate via and pad structures in the through-substrate cavities and over the backside surface of the first semiconductor substrate; and
bonding the first integrated through-substrate via and pad structures to respective one of second bonding pads located on a second semiconductor substrate by surface activated bonding.

14. The method of claim 13, further comprising:
forming via openings through an upper portion of the first semiconductor substrate;
forming an insulating material liner in the via openings and over the top surface of the first semiconductor substrate;
depositing and planarizing a sacrificial material on the insulating material liner in the via openings, wherein remaining portions of the sacrificial material constitute the sacrificial pillar structures.

15. The method of claim 13, further comprising:
anisotropically depositing an insulating material on the backside surface of the first semiconductor substrate after removing the sacrificial pillar structures, wherein a deposited insulating material has a greater thickness on the backside surface of the first semiconductor substrate than at horizontal surfaces of metal interconnect structures that are physically exposed above the through-substrate cavities; and
etching the deposited insulating material, wherein a remaining planar portion of the deposited insulating material constitutes the backside insulating layer.

16. The method of claim 13, further comprising:
depositing a metallic liner on sidewalls of the through-substrate cavities;

depositing a metal fill material on the metallic liner in remaining volumes of the through-substrate cavities; and patterning horizontal portions of the metal fill material and the metallic liner, wherein each first bonding pad structure includes patterned horizontal portions of the metallic liner and the metal fill material.

17. The method of claim 13, wherein:

a first semiconductor chip comprises the first semiconductor substrate, the first semiconductor devices located over a front side surface of the first semiconductor substrate, and the first integrated through-substrate via and pad structures including a respective first through-substrate via structure and a respective first bonding pad structure and comprising a first metallic material;

the first integrated through-substrate via and pad structures vertically extend from the front side surface of the first semiconductor substrate to the backside surface of the first semiconductor substrate and are electrically isolated from the first semiconductor substrate by a respective tubular insulating spacer and by a backside insulating layer contacting the backside surface of the first semiconductor substrate; and each of the first integrated through-substrate via and pad structures has a greater lateral dimension within a horizontal plane located at the front side surface of the first semiconductor substrate than within a horizontal plane including the backside surface of the first semiconductor substrate.

18. The method of claim 17, wherein:

a second semiconductor chip comprises the second semiconductor substrate, second semiconductor devices located over a front side surface of the second semiconductor substrate, and the second bonding pad structures electrically connected to a respective one of the second semiconductor devices; and the first semiconductor chip and the second semiconductor chip are directly bonding by aligning the first bonding pad structures with the respective one of the second bonding pad structures and inducing the surface activated bonding between the first and second bonding pad structures.

19. The method of claim 18, wherein:

the first semiconductor devices comprise a three-dimensional memory device including an alternating stack of insulating layers and electrically conductive layers and a two-dimensional array of memory stack structures including a respective vertical stack of memory elements located at levels of the electrically conductive layers; and the second semiconductor devices in the second semiconductor chip comprise peripheral devices that provide control signals for operation of the three-dimensional memory device of the first semiconductor chip.

20. The method of claim 13, further comprising:

providing a third semiconductor chip comprising a third semiconductor substrate, third semiconductor devices located over a front side surface of the third semiconductor substrate, and third-chip bonding pad structures electrically connected to a respective one of the third semiconductor devices; and bonding the third-chip bonding pad structures to backside bonding pad structures located on a backside surface of the second semiconductor chip by surface activated bonding.

* * * * *